United States Patent
Lee et al.

(10) Patent No.: US 12,283,609 B2
(45) Date of Patent: *Apr. 22, 2025

(54) GATE STRUCTURE OF TRANSISTOR INCLUDING A PLURALITY OF WORK FUNCTION LAYERS AND OXYGEN DEVICE AND METHOD

(71) Applicant: Taiwan Semiconductor Manufacturing Co., Ltd., Hsinchu (TW)

(72) Inventors: Hsin-Yi Lee, Hsinchu (TW); Ji-Cheng Chen, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/425,895

(22) Filed: Jan. 29, 2024

(65) Prior Publication Data

US 2024/0170536 A1 May 23, 2024

Related U.S. Application Data

(63) Continuation of application No. 17/841,217, filed on Jun. 15, 2022, now Pat. No. 11,923,414, which is a
(Continued)

(51) Int. Cl.
*H01L 29/06* (2006.01)
*H01L 21/02* (2006.01)

(52) U.S. Cl.
CPC .... *H01L 29/0673* (2013.01); *H01L 21/02631* (2013.01)

(58) Field of Classification Search
CPC ........... H01L 29/0673; H01L 21/02631; H01L 29/517; H01L 29/4966; H01L 27/092; H01L 29/401; H01L 21/823842; H01L 21/28176; H01L 29/42392; H01L 21/3215; H01L 29/165; H01L 29/66545
See application file for complete search history.

(56) References Cited

U.S. PATENT DOCUMENTS 9,209,247 B2   12/2015   Colinge et al.
9,236,267 B2   1/2016   De et al.
(Continued)

FOREIGN PATENT DOCUMENTS

KR   1020200051079 A   5/2020
KR   1020200138462 A   12/2020
(Continued)

*Primary Examiner* — Changhyun Yi
(74) *Attorney, Agent, or Firm* — Slater Matsil, LLP

(57) ABSTRACT

A method of forming semiconductor devices having improved work function layers and semiconductor devices formed by the same are disclosed. In an embodiment, a method includes depositing a gate dielectric layer on a channel region over a semiconductor substrate; depositing a first p-type work function metal on the gate dielectric layer; performing an oxygen treatment on the first p-type work function metal; and after performing the oxygen treatment, depositing a second p-type work function metal on the first p-type work function metal.

20 Claims, 32 Drawing Sheets

Related U.S. Application Data continuation of application No. 17/198,650, filed on Mar. 11, 2021, now Pat. No. 11,411,079.

(60) Provisional application No. 63/139,983, filed on Jan. 21, 2021.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,425,279 B1 | 8/2016 | Ando et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,510,620 B1 | 12/2019 | Chanemougame et al. |
| 10,872,826 B2 | 12/2020 | Wu et al. |
| 10,978,350 B2 | 4/2021 | Chen et al. |
| 11,411,079 B1 * | 8/2022 | Lee ............... H01L 29/78696 |
| 11,923,414 B2 * | 3/2024 | Lee ............... H01L 21/28176 |
| 2019/0081151 A1 | 3/2019 | Lee et al. |
| 2020/0035563 A1 | 1/2020 | Zhang et al. |
| 2020/0091006 A1 | 3/2020 | Tsai et al. |
| 2020/0144255 A1 | 5/2020 | Lee et al. |
| 2020/0381311 A1 | 12/2020 | Kim et al. |
| 2021/0013110 A1 * | 1/2021 | Mun ............... H01L 21/823821 |

FOREIGN PATENT DOCUMENTS

| | | |
|---|---|---|
| TW | 201913755 A | 4/2019 |
| TW | 202030838 A | 8/2020 |

* cited by examiner

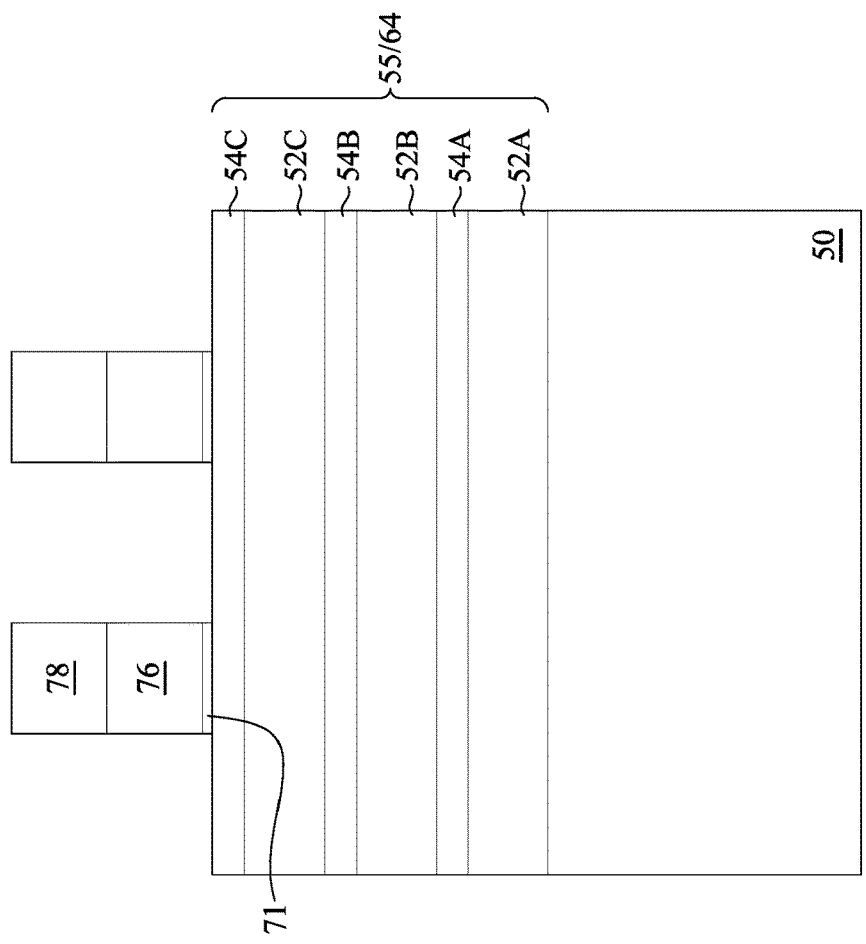
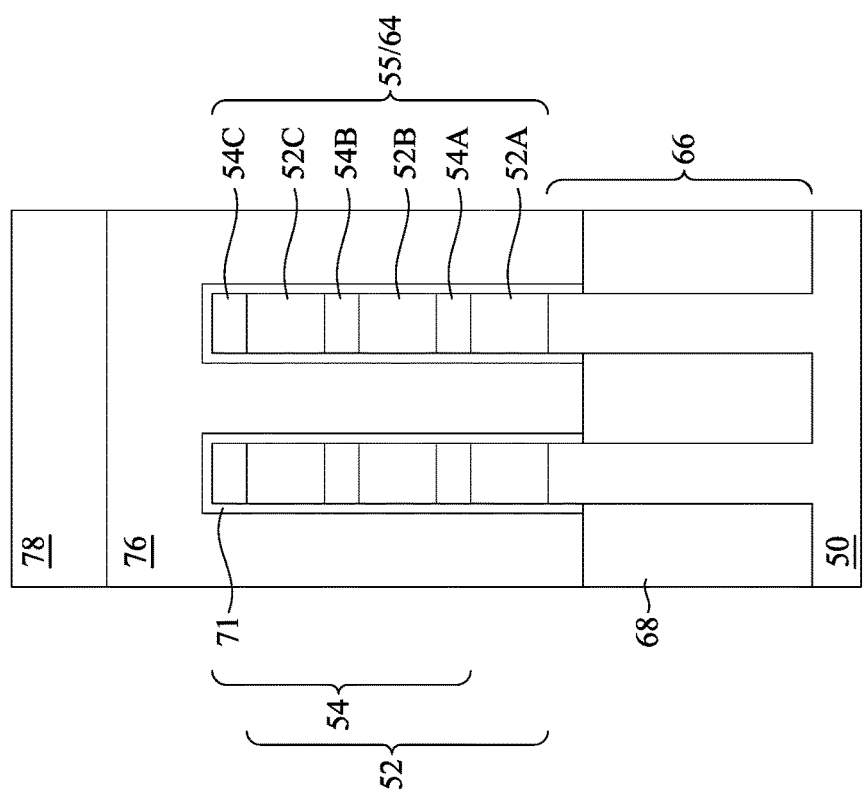
Fig. 6A
Fig. 6B

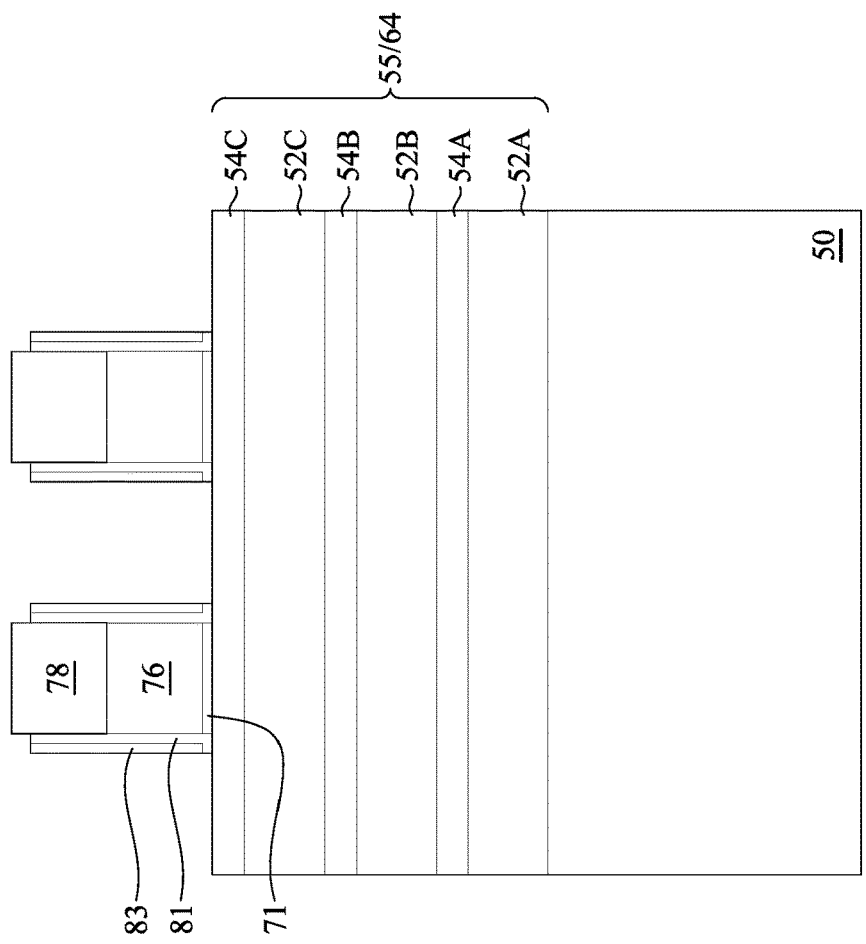
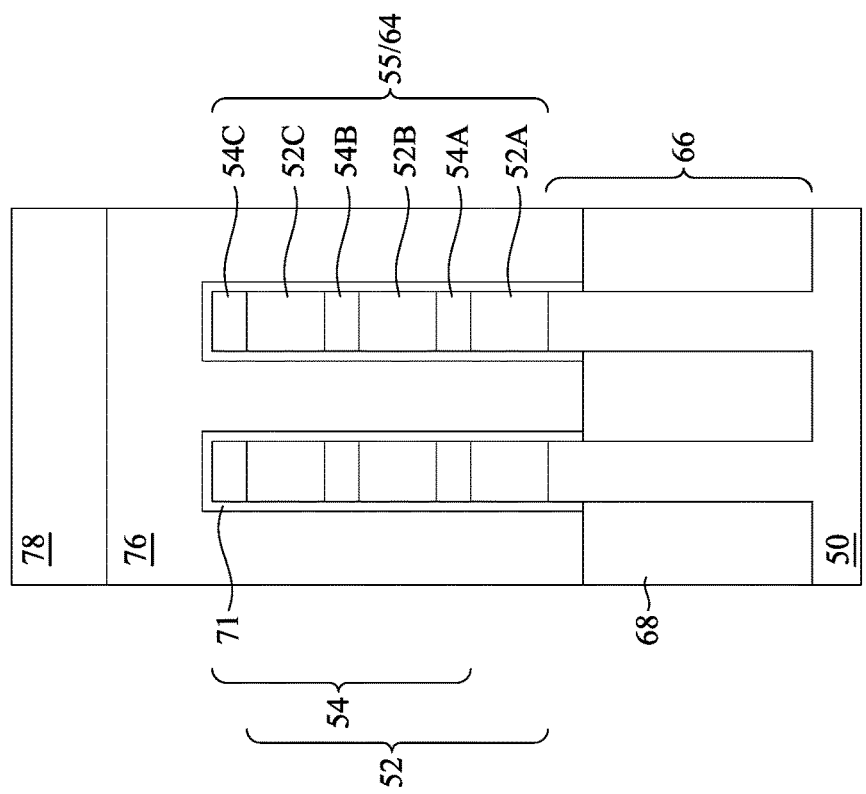
Fig. 8B
Fig. 8A

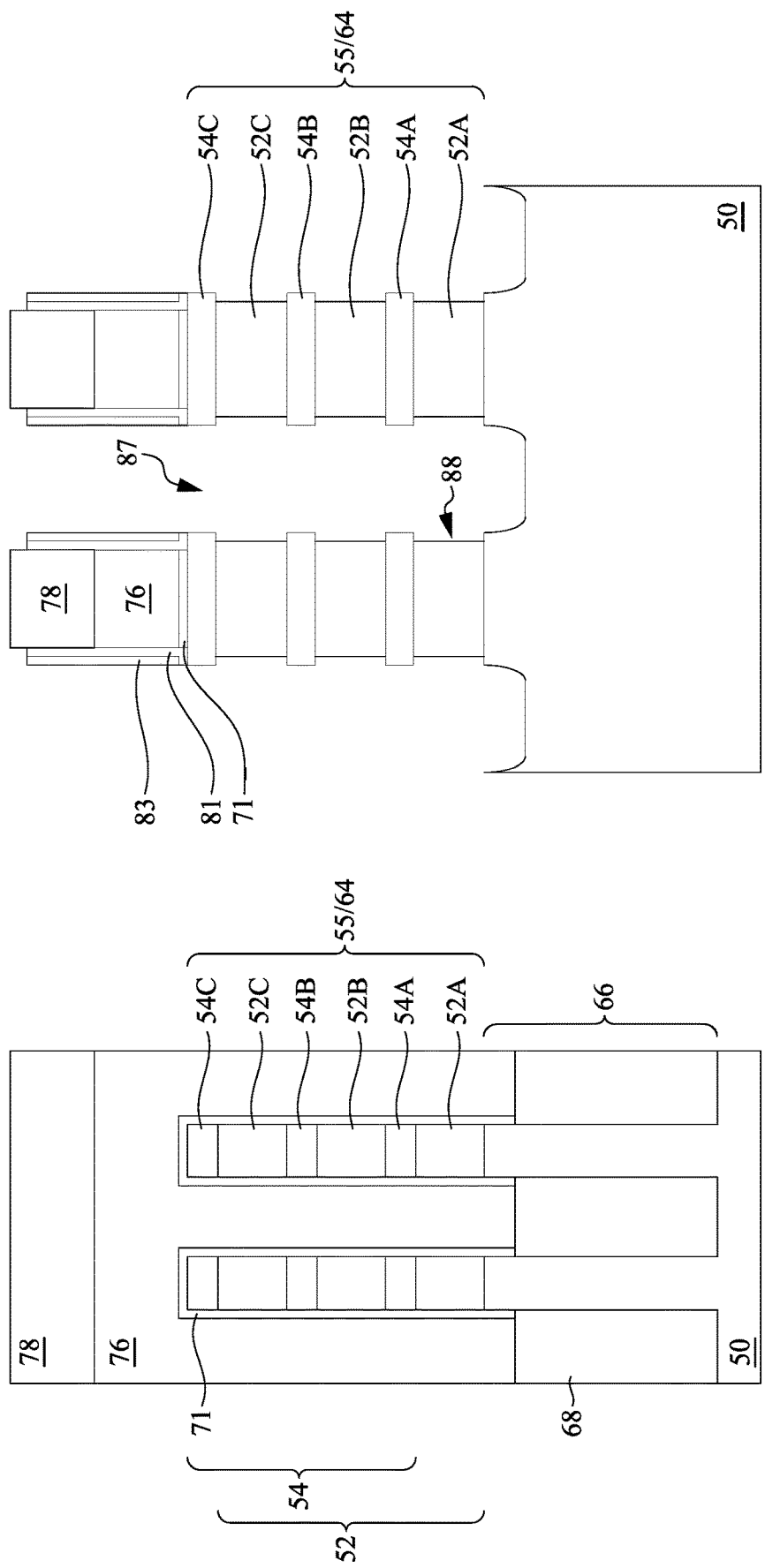

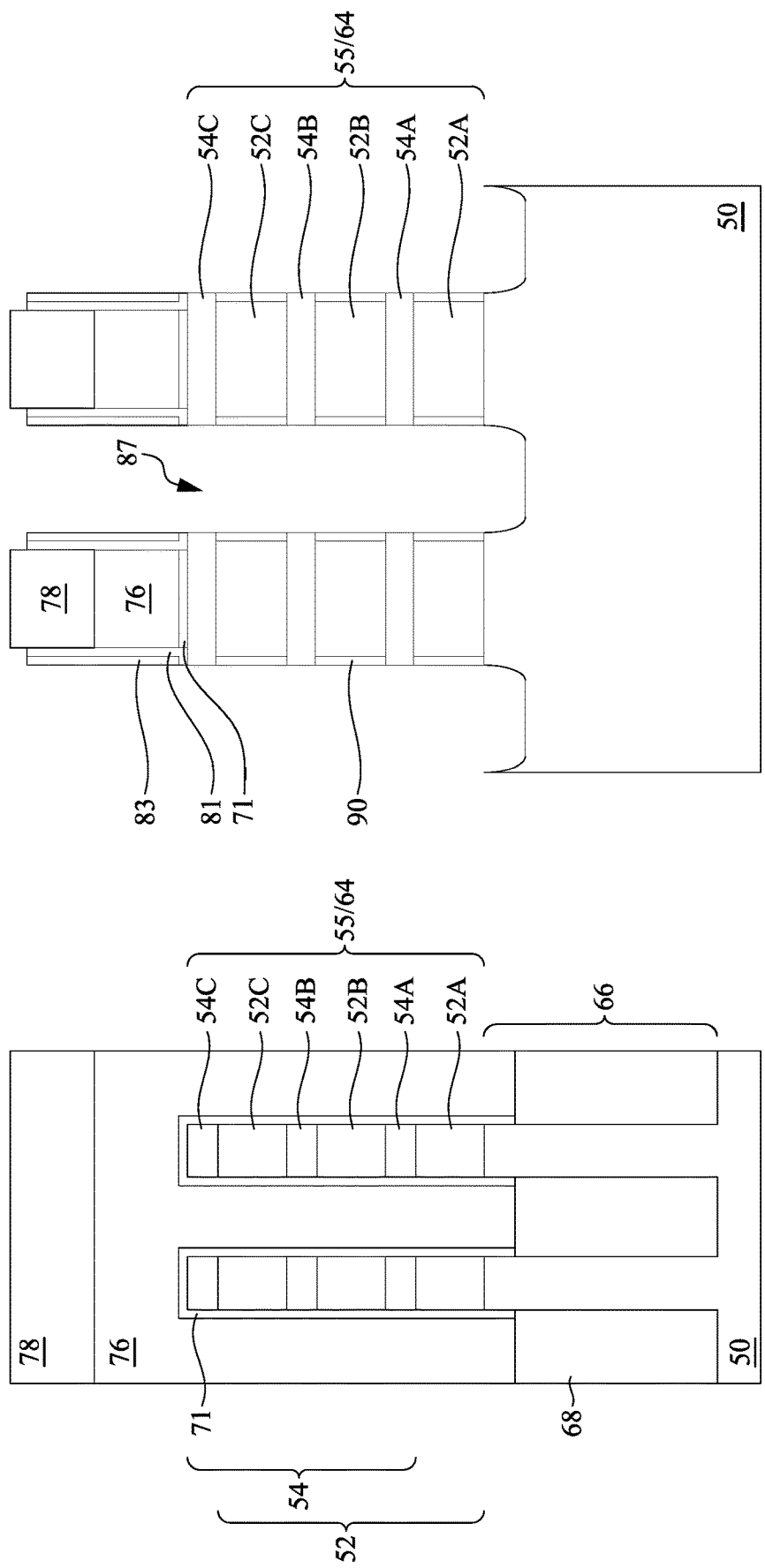

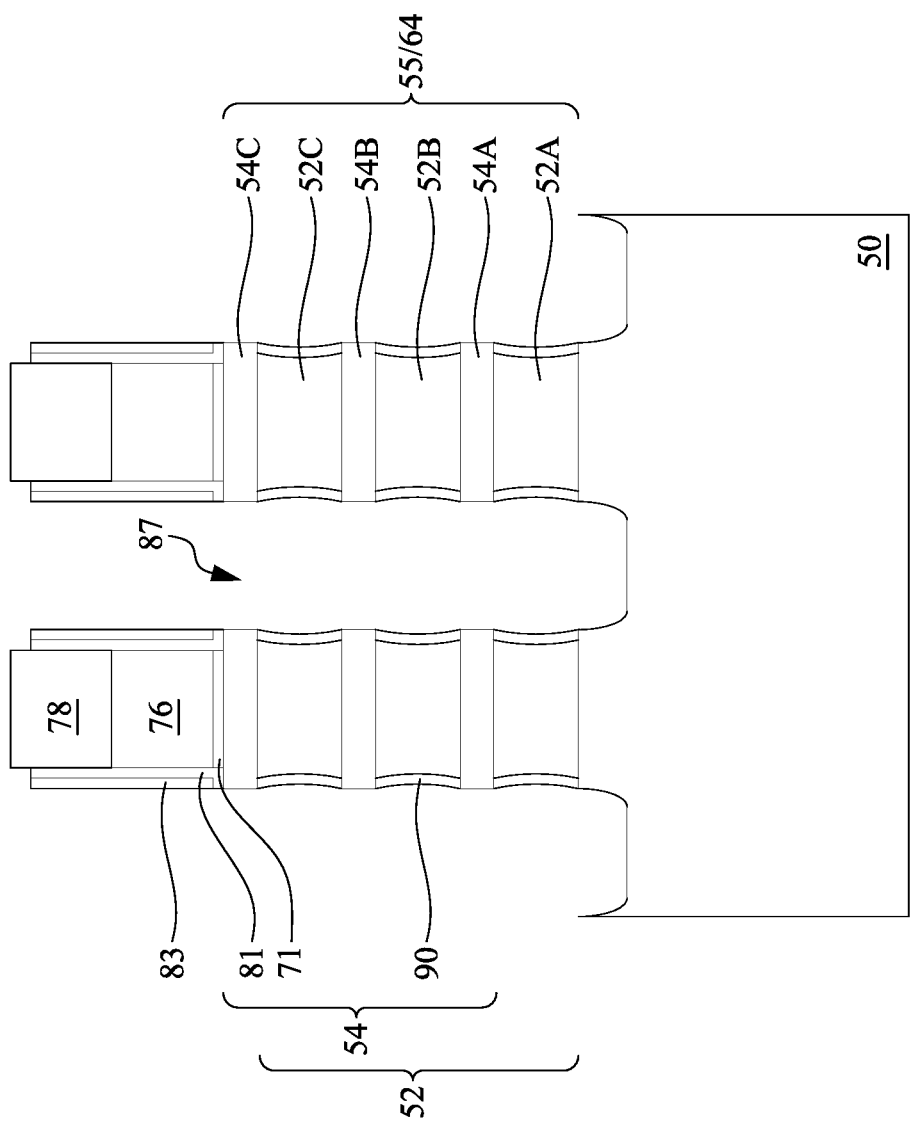

US 12,283,609 B2

GATE STRUCTURE OF TRANSISTOR INCLUDING A PLURALITY OF WORK FUNCTION LAYERS AND OXYGEN DEVICE AND METHOD

PRIORITY CLAIM AND CROSS-REFERENCE

This application is a continuation of U.S. patent application Ser. No. 17/841,217, filed on Jun. 15, 2022, entitled "Semiconductor Device and Method," which is a continuation of U.S. patent application Ser. No. 17/198,650, entitled "Semiconductor Device and Method," and filed on Mar. 11, 2021, now U.S. Pat. No. 11,411,079 issued on Aug. 9, 2022; which claims the benefit of U.S. Provisional Application No. 63/139,983, filed on Jan. 21, 2021, and entitled "Novel Laminate TiN Deposition Method in Nanosheet Device and Structure Formed Thereby;" which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C, 8A, 8B, 8C, 9A, 9B, 9C, 10A, 10B, 11A, 11B, 11C, 12A, 12B, 12C, 12D, 12E, 13A, 13B, 14A, 14B, 15A, 15B, 16A, 16B, 17A, 17B, 18A, 18B, 19A, 19B, 19C, 19D, 20A, 20B, 20C, 20D, 21A, 21B, 22A, and 22B are cross-sectional views of intermediate stages in the manufacturing of nano-FETs, in accordance with some embodiments.

DETAILED DESCRIPTION

Figure 1:
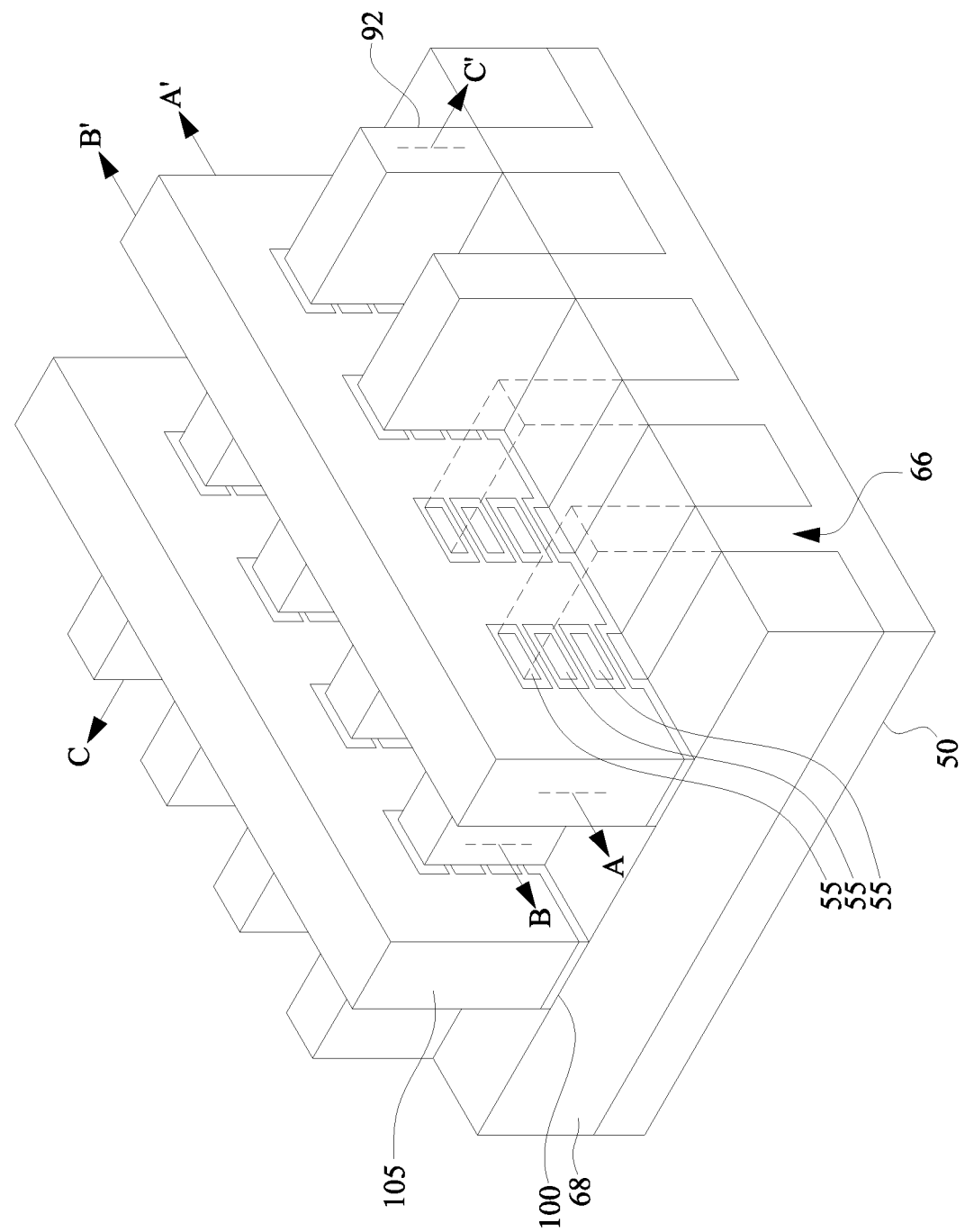
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a gate electrode with an improved work function structure and methods for forming the same. The work function structure may be formed by depositing a work function layer, exposing the work function layer to an oxygen-containing environment, and repeating this process until a sufficient thickness is achieved. The work function structure may be deposited over a gate dielectric layer. Exposing the work function layers to the oxygen-containing environment allows oxygen to diffuse into the work function layers and collect at an interface between the gate dielectric layer and the work function structure. The increased oxygen concentration in the work function structure and at the interface between the gate dielectric layer and the work function structure increases an effective work function, increases a flat band voltage ($V_{fb}$), and reduces a threshold voltage ($V_t$) of devices including the work function structure. This improves device speed and performance.

Some embodiments discussed herein are described in the context of a die including nano-FETs. However, various embodiments may be applied to dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructures 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Gate dielectrics 100 extend along top surfaces and side surfaces of the fins 66 and along top surfaces, side surfaces, and bottom surfaces of the nanostructures 55. Gate electrodes 105 are over the gate dielectrics loft Epitaxial source/drain regions 92 are disposed on the fins 66 on opposing sides of the gate dielectrics wo and the gate electrodes 105.

FIG. 1 further illustrates reference cross-sections that are used in later figures. Cross-section A-A' is along a longitudinal axis of a gate electrode 105 and in a direction, for example, perpendicular to the direction of current flow between the epitaxial source/drain regions 92 of a nano-FET. Cross-section B-B' is parallel to cross-section A-A' and extends through epitaxial source/drain regions 92 of multiple nano-FETs. Cross-section C-C' is perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used. In addition, some embodiments contemplate aspects used in planar devices, such as planar FETs or in fin field-effect transistors (FinFETs).

FIGS. 2 through 22B are cross-sectional views of intermediate stages in the manufacturing of nano-FETs, in accordance with some embodiments. FIGS. 2 through 5, 6A, 7A, 8A, 9A, 10A, 11A, 12A, 13A, 14A, 15A, 16A, 17A, 18A, 19A, 19C, 20A, 20C, 21A, and 22A illustrate reference cross-section A-A' illustrated in FIG. 1. FIGS. 6B, 7B, 8B, 9B, 10B, 11B, 11C, 12B, 12E, 13B, 14B, 15B, 16B, 17B, 18B, 19B, 19D, 20B, 20D, 21B, and 22B illustrate reference cross-section B-B' illustrated in FIG. 1. FIGS. 6C, 7C, 8C, 9C, 12C, and 12D illustrate reference cross-section C-C' illustrated in FIG. 1.

Figure 2:
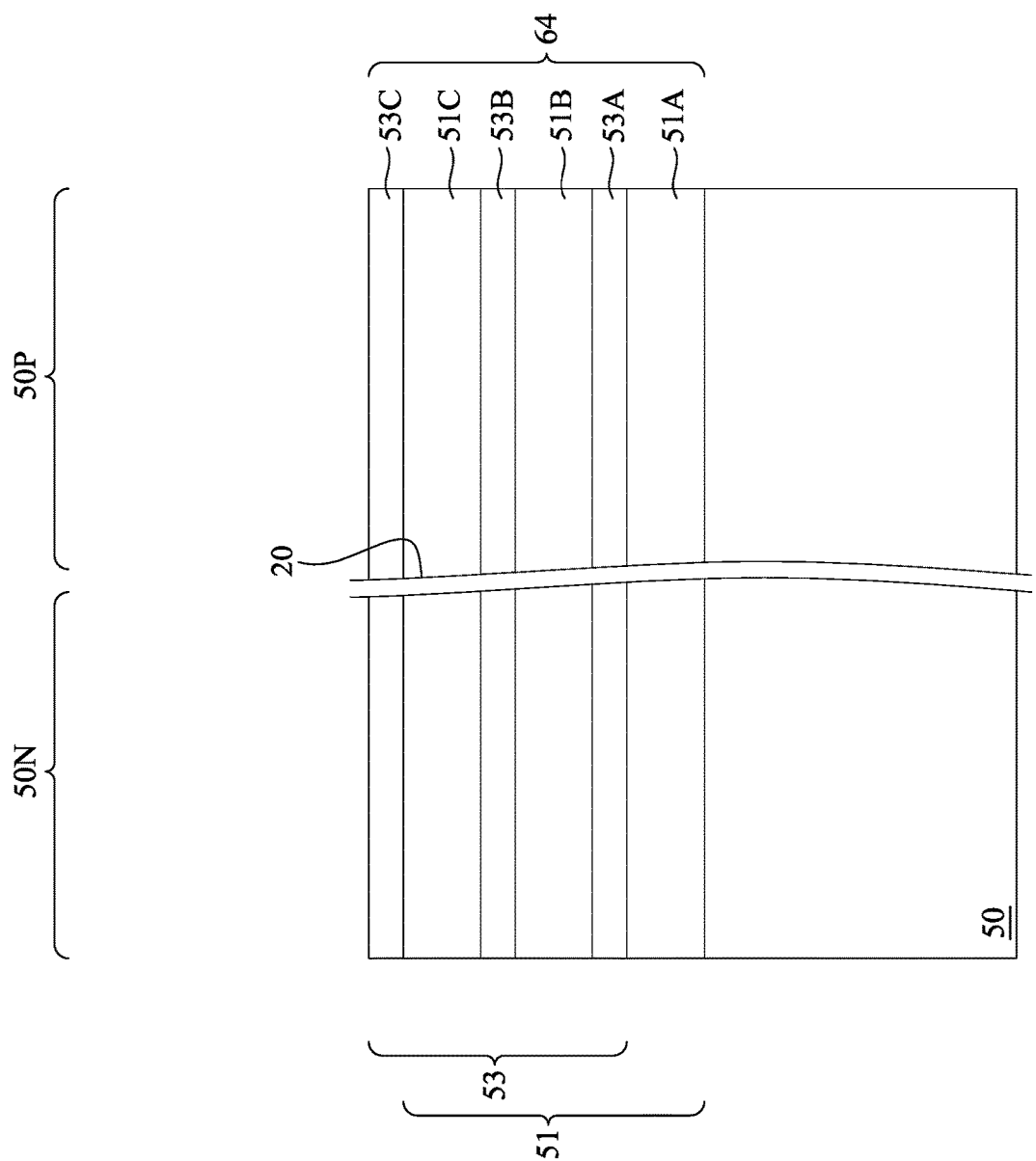

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers 51 will be removed and the second semiconductor layers 53 will be patterned to form channel regions of nano-FETs in the n-type region 50N and the p-type region 50P. However, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material, such as silicon germanium or the like, and the second semiconductor layers 53 may be formed of a second semiconductor material, such as silicon, silicon carbon, or the like. The multi-layer stack 64 is illustrated as having a bottommost semiconductor layer formed of the first semiconductor materials for illustrative purposes. In some embodiments, the multi-layer stack 64 may be formed such that the bottommost layer is formed of the second semiconductor materials.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53 to be patterned to form channel regions of nano-FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material, thereby allowing the first semiconductor layers 51 to be patterned to form channel regions of nano-FETs.

Figure 3:
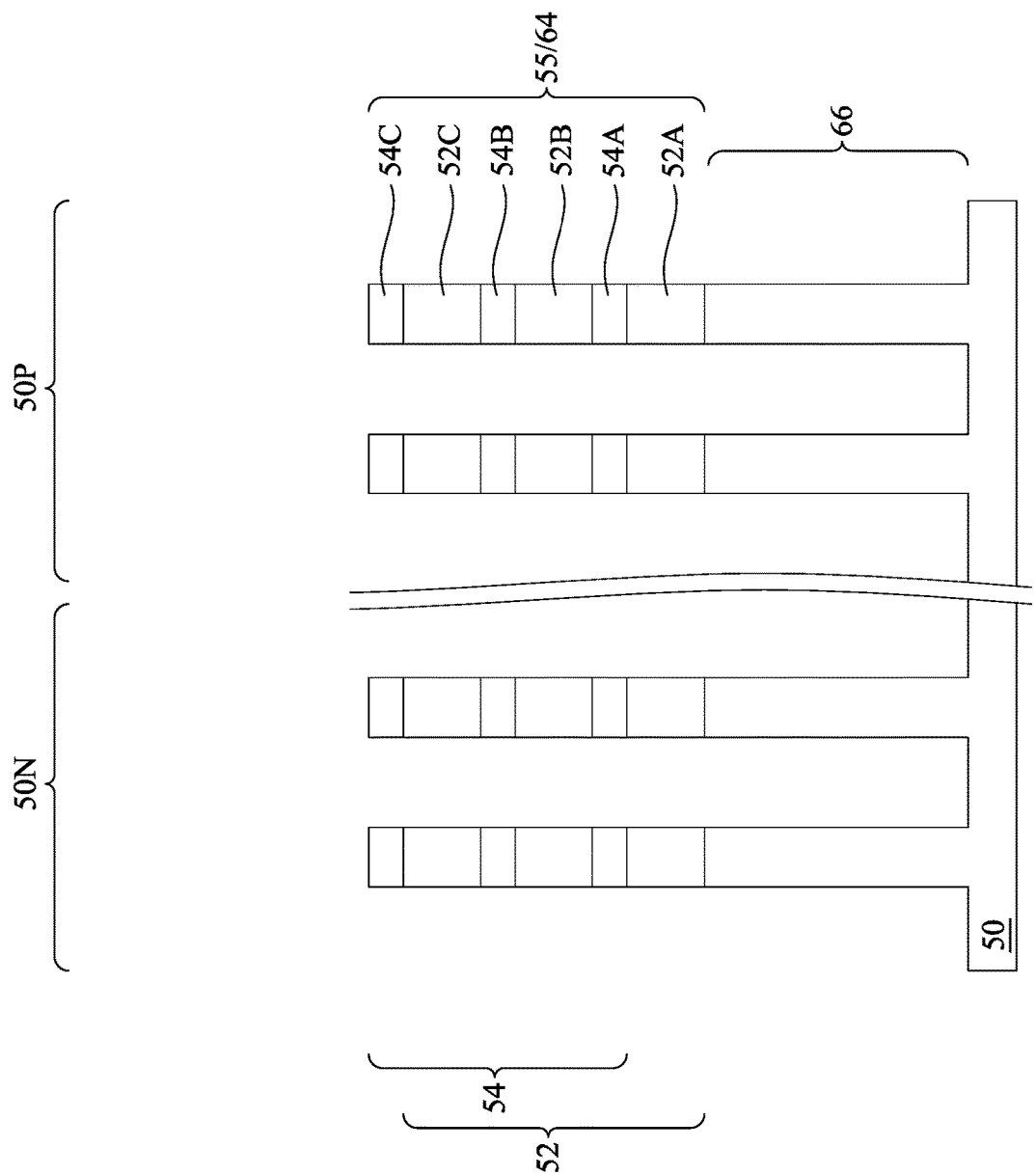

In FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), a neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. In some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than widths of the fins 66 in the p-type region 50P. Further, while each of the fins 66 and the nanostructures 55 are illustrated as having consistent widths throughout, in other embodiments, the fins 66 and/or the nanostructures 55 may have tapered sidewalls such that widths of the fins 66 and/or the nanostructures 55 continuously increases in a direction towards the substrate 50. In such embodiments, each of the nanostructures 55 may have different widths and be trapezoidal in shape.

Figure 4:
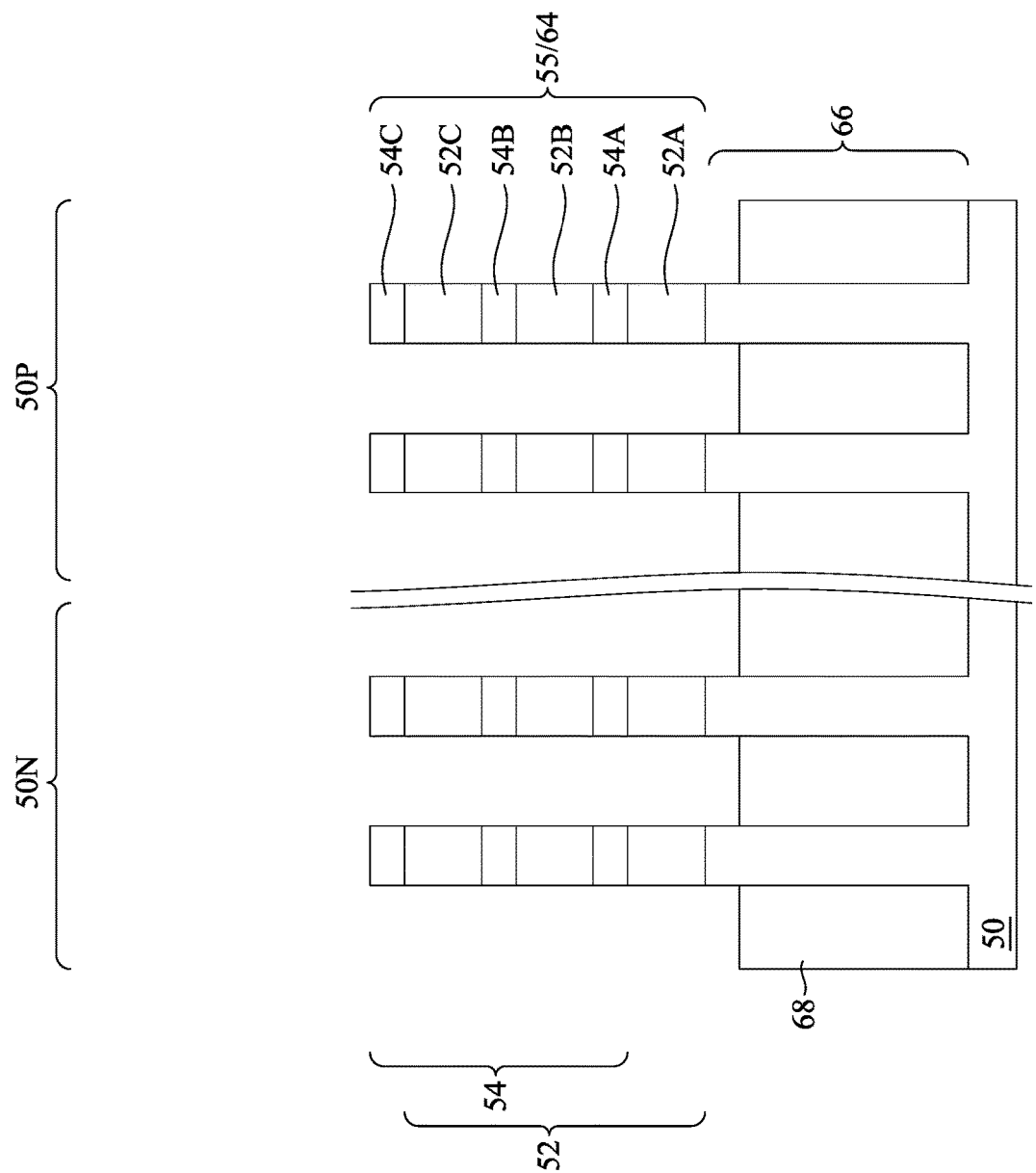

In FIG. 4, shallow trench isolation (STI) regions 68 are formed adjacent the fins 66. The STI regions 68 may be formed by depositing an insulation material over the substrate 50, the fins 66, and the nanostructures 55, and between adjacent ones of the fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along surfaces of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that the nanostructures 55 and upper portions of fins 66 in the n-type region 50N and the p-type region 50P protrude from between neighboring STI regions 68. Further, the top surfaces of the STI regions 68 may have flat surfaces as illustrated, convex surfaces, concave surfaces (such as dishing), or combinations thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric acid (dHF) may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and the resulting first nanostructures 52) and the second semiconductor layers 53 (and the resulting second nanostructures 54) are illustrated and discussed herein as comprising the same materials in the p-type region 50P and the n-type region 50N for illustrative purposes only. In some embodiments, one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
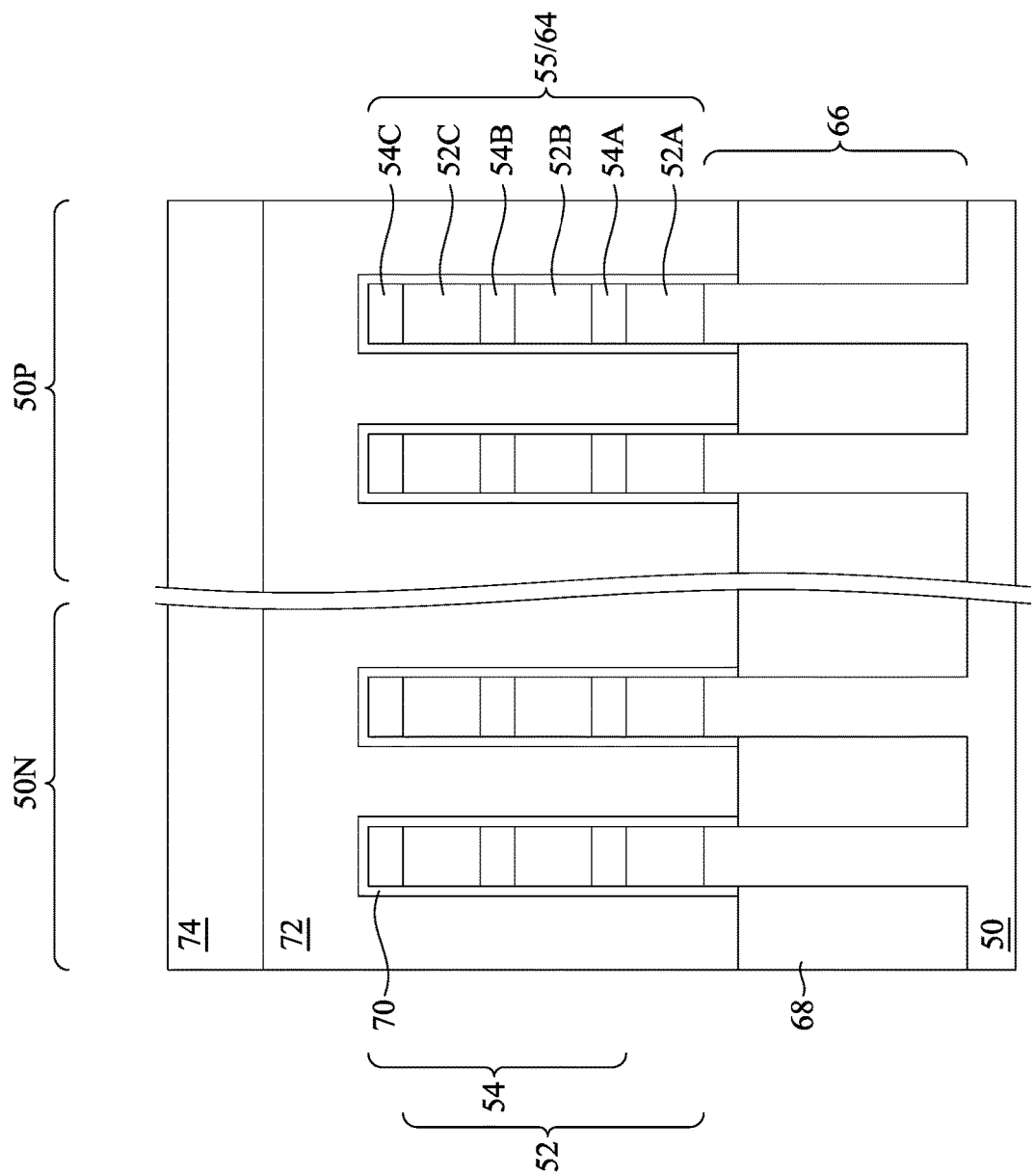

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6C:
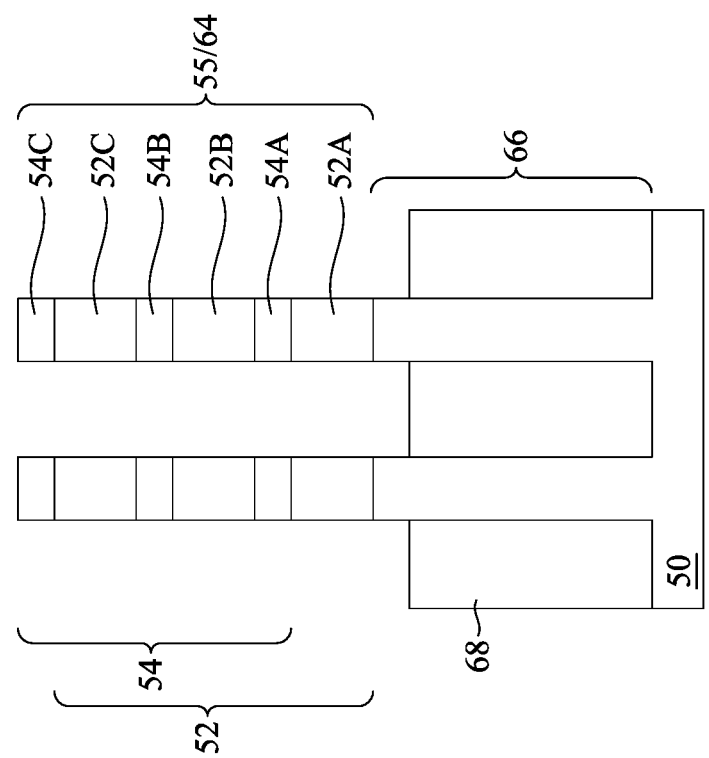

FIGS. 6A through 22B illustrate various additional steps in the manufacturing of embodiment devices. FIGS. 6A through 22B illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66 and portions of the second nanostructures 54, which form channel regions. The pattern of the masks 78 may be used to separate each of the dummy gates 76 from adjacent dummy gates 76. The dummy gates 76 may have lengthwise directions perpendicular to lengthwise directions of respective ones of the fins 66.

Figure 7B:
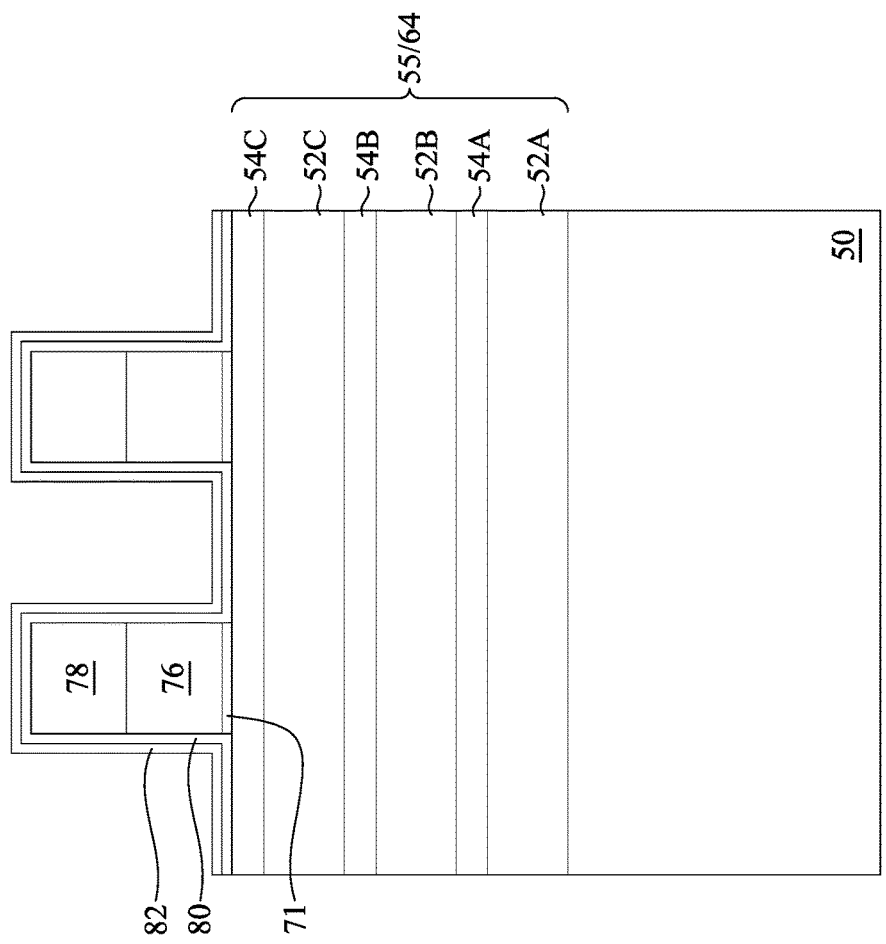
Figure 7A:
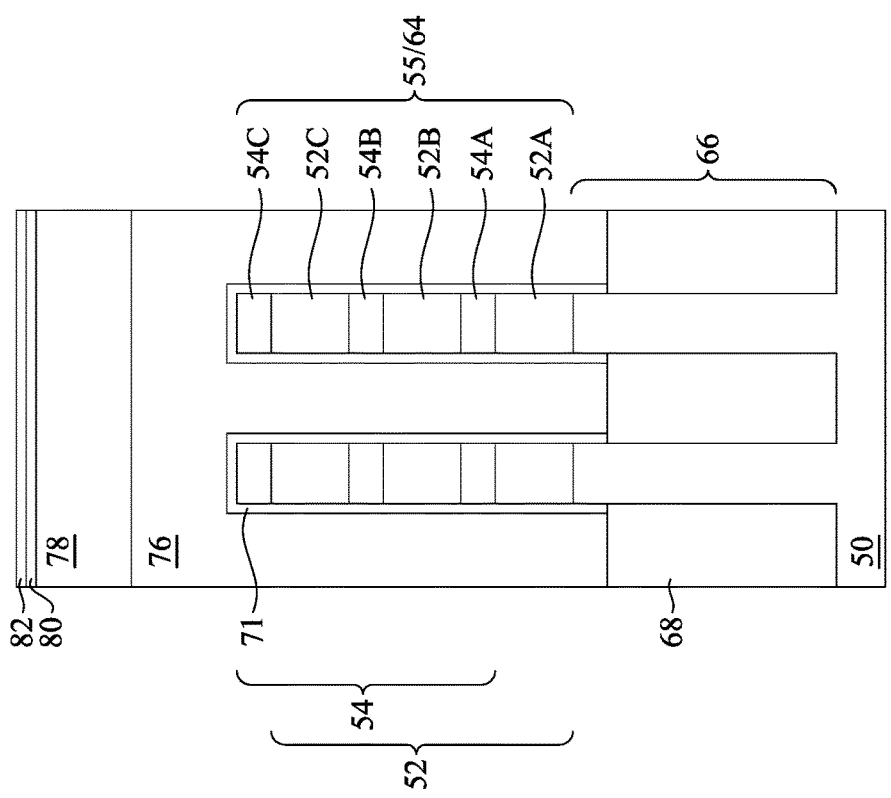
Figure 7C:
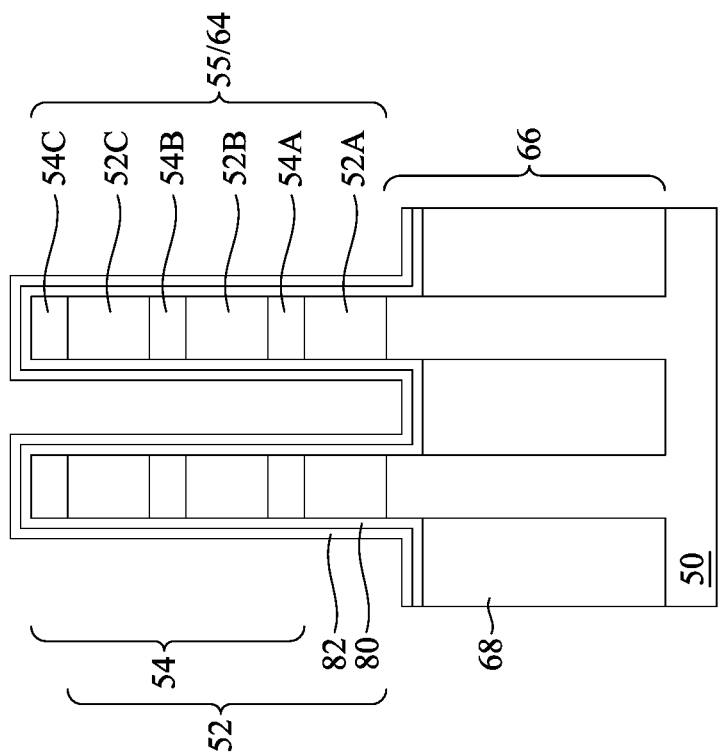

In FIGS. 7A through 7C, a first spacer layer 80 and a second spacer layer 82 are formed over the structures illustrated in FIGS. 6A through 6C. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; side surfaces of the fins 66, the dummy gate dielectrics 71, and the dummy gates 76; and top surfaces and side surfaces of the nanostructures 55 and the masks 78. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like. The first spacer layer 80 and the second spacer layer 82 may comprise low-k dielectric materials.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and the exposed nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and the exposed nanostructures 55 in the n-type region 50N. The mask may then be removed. The n-type impurities may be the any of the n-type impurities previously discussed and the p-type impurities may be the any of the p-type impurities previously discussed. The lightly doped source/drain regions may have a concentration of impurities in a range from about $1 \times 10^{15}$ atoms/cm$^3$ to about $1 \times 10^{19}$ atoms/cm$^3$. An anneal may be used to repair implant damage and to activate the implanted impurities.

Figure 8C:
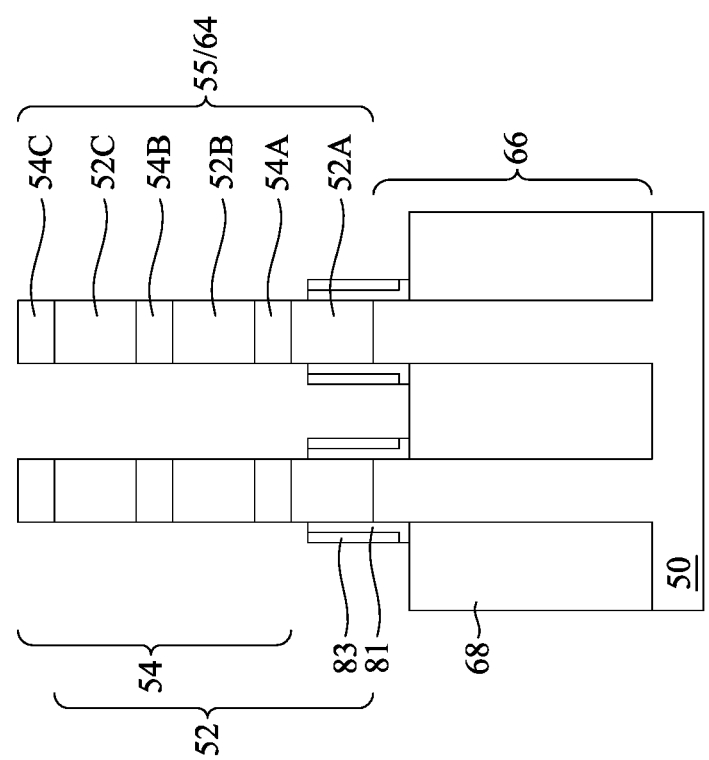

In FIGS. 8A through 8C, the first spacer layer 80 and the second spacer layer 82 are etched to form first spacers 81 and second spacers 83, respectively. As will be discussed in greater detail below, the first spacers 81 and the second spacers 83 act to self-align subsequently formed source/drain regions, as well as to protect sidewalls of the fins 66 and/or the nanostructures 55 during subsequent processing. The first spacer layer 80 and the second spacer layer 82 may be etched using suitable etching processes, such as isotropic etching processes (e.g., wet etching processes), anisotropic etching processes (e.g., dry etching processes), or the like. In some embodiments, the material of the second spacer layer 82 has a different etch rate than the material of the first spacer layer 80, such that the first spacer layer 80 may act as an etch stop layer when patterning the second spacer layer 82. The second spacer layer 82 may act as a mask when patterning the first spacer layer 80. For example, the second spacer layer 82 may be etched using an anisotropic etch process in which the first spacer layer 80 acts as an etch stop layer. Remaining portions of the second spacer layer 82 form the second spacers 83, as illustrated in FIGS. 8B and 8C. The second spacers 83 then act as a mask while etching exposed portions of the first spacer layer 80 forming the first spacers 81, as illustrated in FIGS. 8B and 8C.

As illustrated in FIG. 8B, the first spacers 81 and the second spacers 83 are disposed on sidewalls of the masks 78, the dummy gates 76, and the dummy gate dielectrics 71. In some embodiments, top surfaces of the first spacers 81 and the second spacers 83 may be disposed below top surfaces of the masks 78. The top surfaces of the first spacers 81 and the second spacers 83 may be disposed level with or above the top surfaces of the masks 78. In some embodiments, the second spacers 83 may be removed from over the first spacers 81 adjacent the masks 78, the dummy gates 76, and the dummy gate dielectrics 71. As illustrated in FIG. 8C, the first spacers 81 and the second spacers 83 are disposed on sidewalls of the fins 66 and/or nanostructures 55.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figures 9A, 9B:
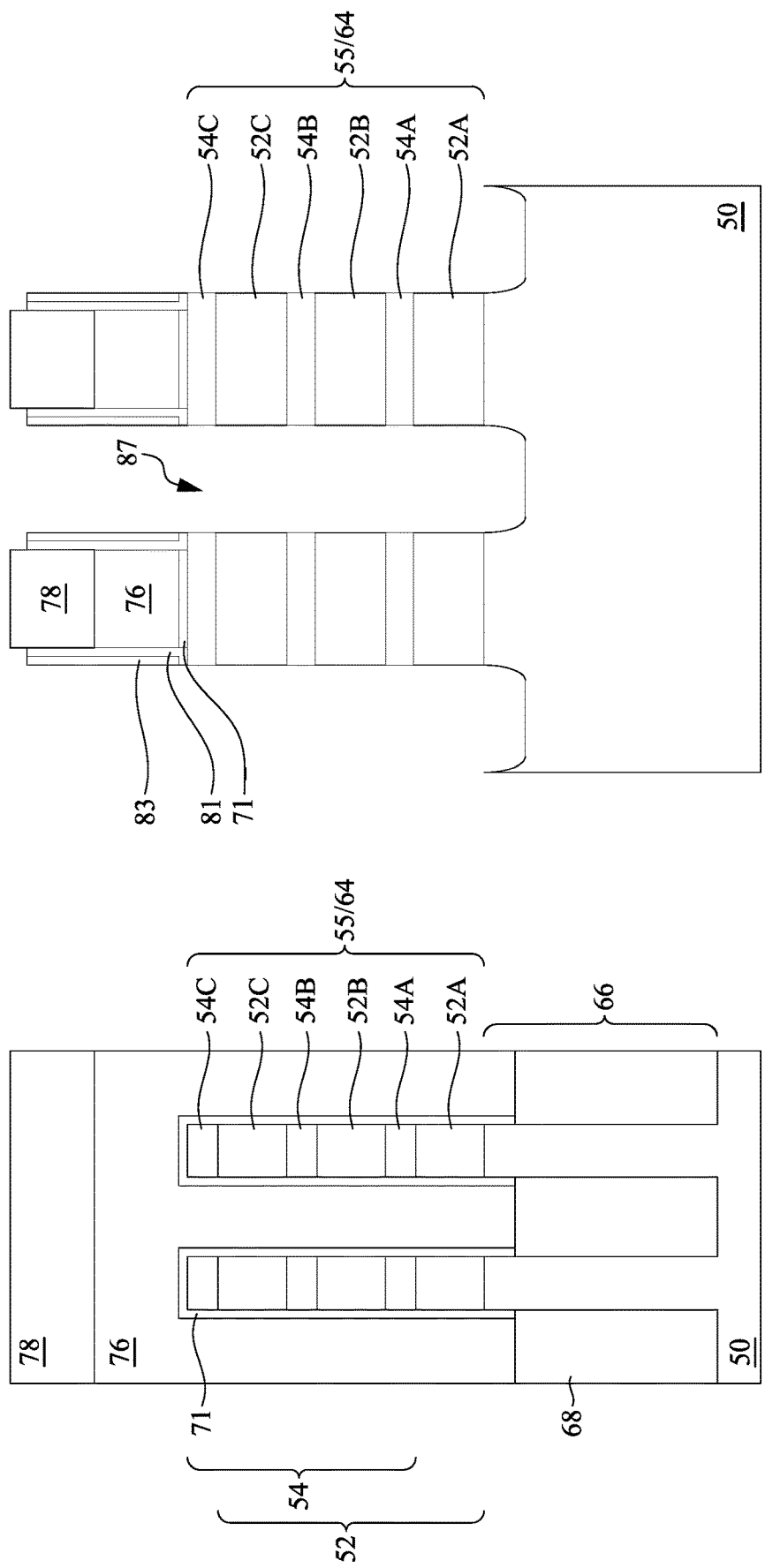
Figure 9C:
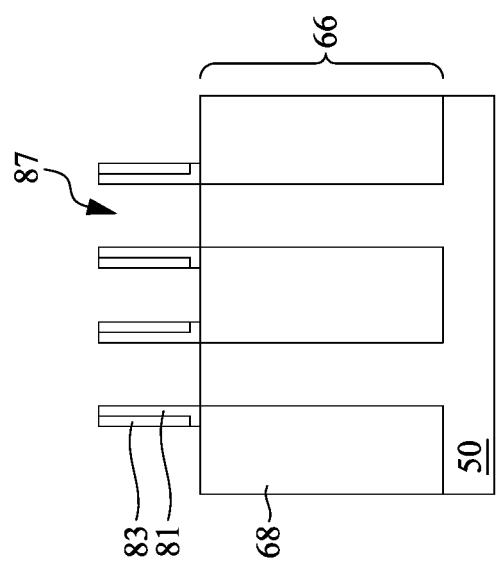

In FIGS. 9A through 9C, first recesses 87 are formed in the fins 66, the nanostructures 55, and the substrate 50. Epitaxial source/drain regions will be subsequently formed in the first recesses 87. The first recesses 87 may extend through the first nanostructures 52 and the second nanostructures 54, and into the substrate 50. In some embodiments, top surfaces of the STI regions 68 may be level with bottom surfaces of the first recesses 87. In some embodiments, the top surfaces of the STI regions 68 may be above or below the bottom surfaces of the first recesses 87. The first recesses 87 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 87. A single etch process or multiple etch processes may be used to etch each layer of the nanostructures 55 and/or the fins 66. Timed etch processes may be used to stop the etching after the first recesses 87 reach desired depths.

In FIGS. 10A and 10B, portions of sidewalls of the layers of the multi-layer stack 64 formed of the first semiconductor materials (e.g., the first nanostructures 52) exposed by the first recesses 87 are etched to form sidewall recesses 88. Although sidewalls of the first nanostructures 52 adjacent the sidewall recesses 88 are illustrated as being straight in FIG. 10B, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52.

In FIGS. 11A through 11C, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and subsequently formed gate structures. As will be discussed in detail below, the source/drain regions will be formed in the first recesses 87, while the first nanostructures 52 will be replaced with the gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as flush with sidewalls of the second nanostructures 54, the outer sidewalls of the first inner spacers 90 may extend beyond or be recessed from sidewalls of the second nanostructures 54.

Moreover, although the outer sidewalls of the first inner spacers 90 are illustrated as straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A through 12E) by subsequent etching processes, such as etching processes used to form gate structures.

Figures 12A, 12B:
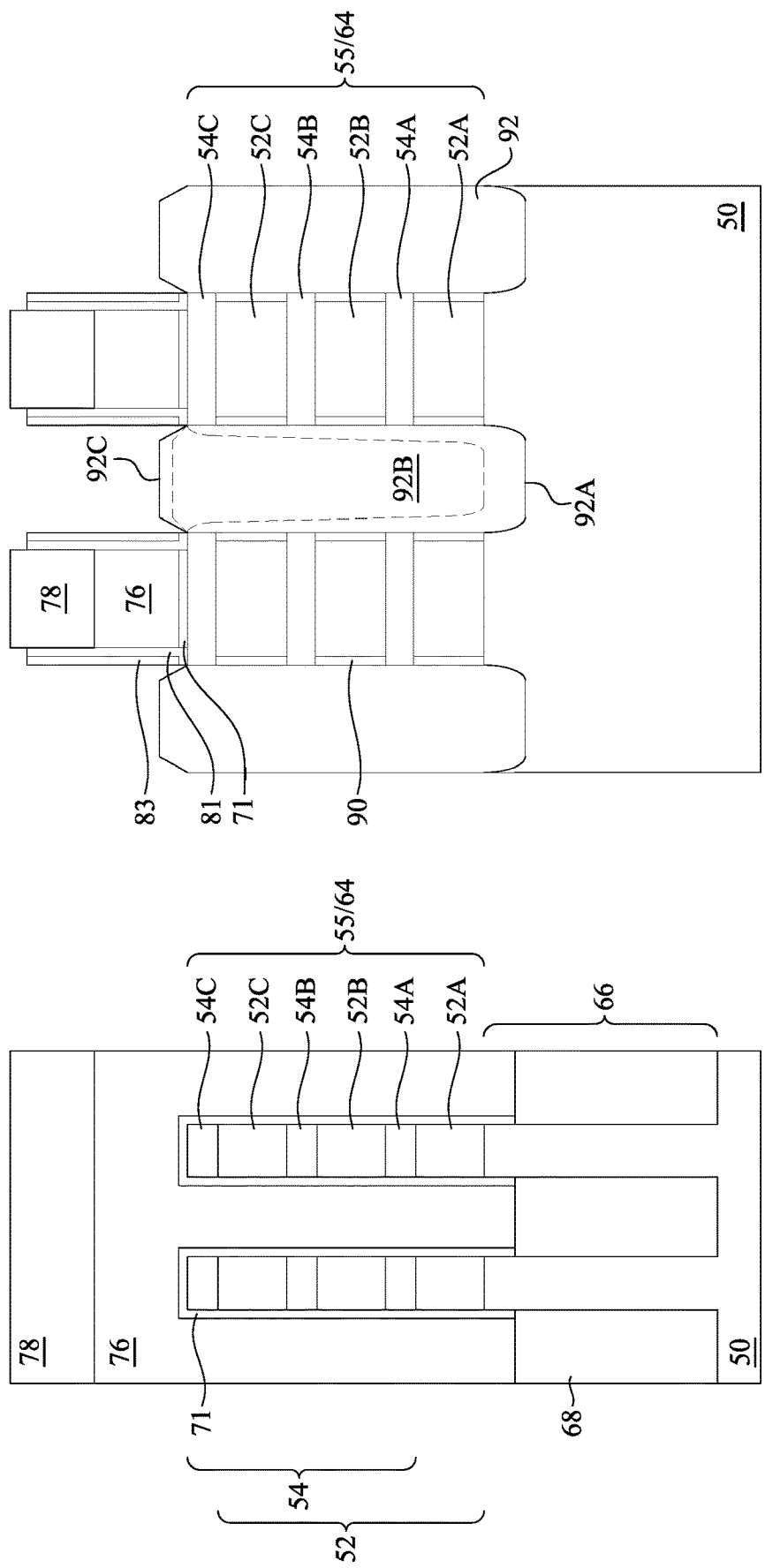

In FIGS. 12A through 12E, epitaxial source/drain regions 92 are formed in the first recesses 87. In some embodiments, the epitaxial source/drain regions 92 may exert stress on the second nanostructures 54, thereby improving performance. As illustrated in FIG. 12B, the epitaxial source/drain regions 92 are formed in the first recesses 87 such that each dummy gate 76 is disposed between respective neighboring pairs of the epitaxial source/drain regions 92. In some embodiments, the first spacers 81 and the second spacers 83 are used to separate the epitaxial source/drain regions 92 from the dummy gates 76 and the first inner spacers 90 are used to separate the epitaxial source/drain regions 92 from the first nanostructures 52 by appropriate lateral distances so that the epitaxial source/drain regions 92 do not short out subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 87 of the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous-doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 87 of the p-type region 50P. The epitaxial source/drain regions 92 may include any acceptable material appropriate for p-type nano-FETs. For example, if the second nanostructures 54 are silicon, the epitaxial source/drain regions 92 may comprise materials exerting a compressive strain on the second nanostructures 54, such as silicon-germanium, boron doped silicon-germanium, germanium, germanium tin, or the like. The epitaxial source/drain regions 92 may also have surfaces raised from respective upper surfaces of the nanostructures 55 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

Figure 12C:
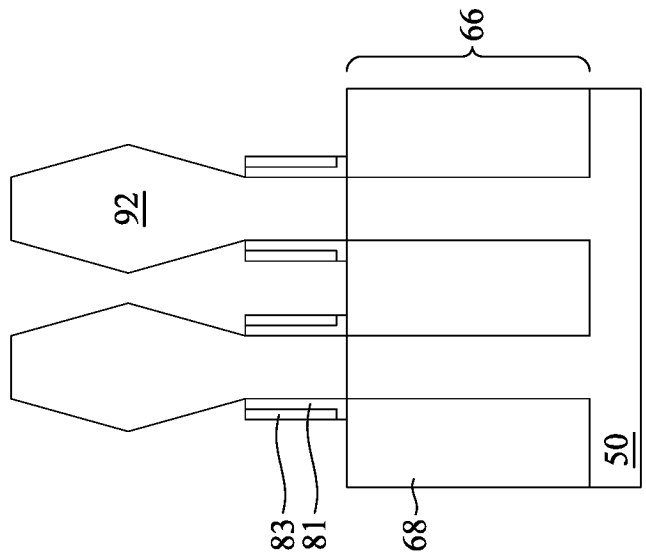
Figure 12D:
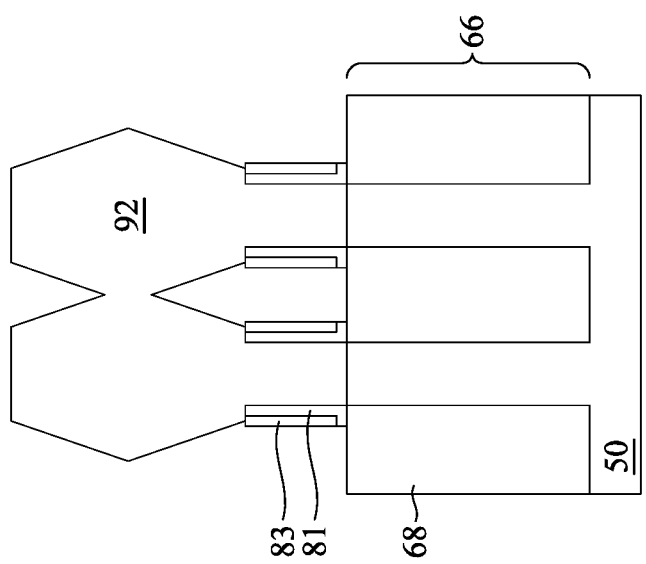

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, the facets cause adjacent epitaxial source/drain regions 92 of a same nano-FET to merge as illustrated by FIG. 12C. In some embodiments, adjacent epitaxial source/drain regions 92 remain separated after the epitaxy process is completed as illustrated by FIG. 12D. In the embodiments illustrated in FIGS. 12C and 12D, the first spacers 81 may be formed over top surfaces of the STI regions 68 and may block the epitaxial growth. In some embodiments, the first spacers 81 may cover portions of sidewalls of the nanostructures 55, further blocking the epitaxial growth. In some embodiments, the spacer etch used to form the first spacers 81 may be adjusted to remove the spacer material to allow the epitaxial source/drain regions 92 to extend to the top surfaces of the STI regions 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12E:
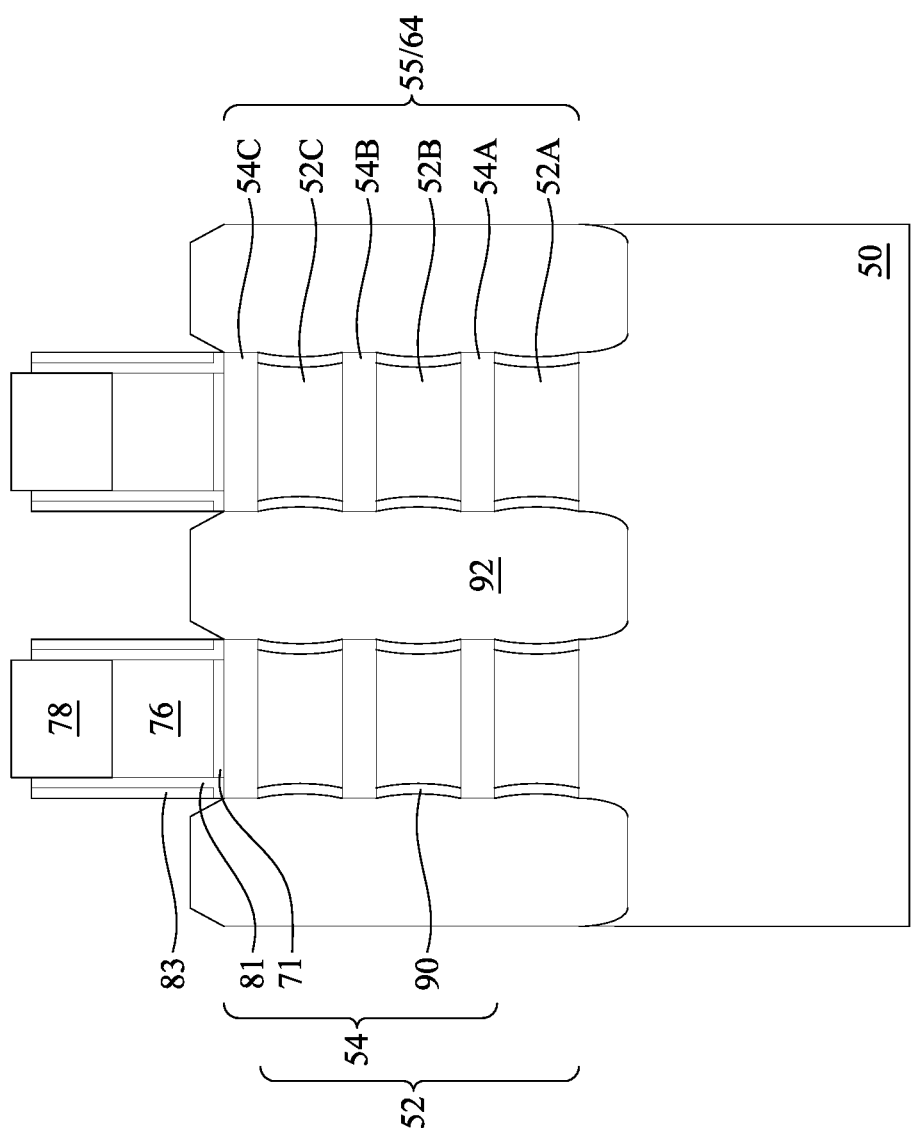

FIG. 12E illustrates an embodiment in which sidewalls of the first nanostructures 52 are concave and outer sidewalls of the first inner spacers 90 are concave. The first inner spacers 90 are recessed from sidewalls of the second nanostructures 54. As illustrated in FIG. 12E, the epitaxial source/drain regions 92 may be formed in contact with the first inner spacers 90. The epitaxial source/drain regions 92 may extend past sidewalls of the second nanostructures 54.

Figure 13B:
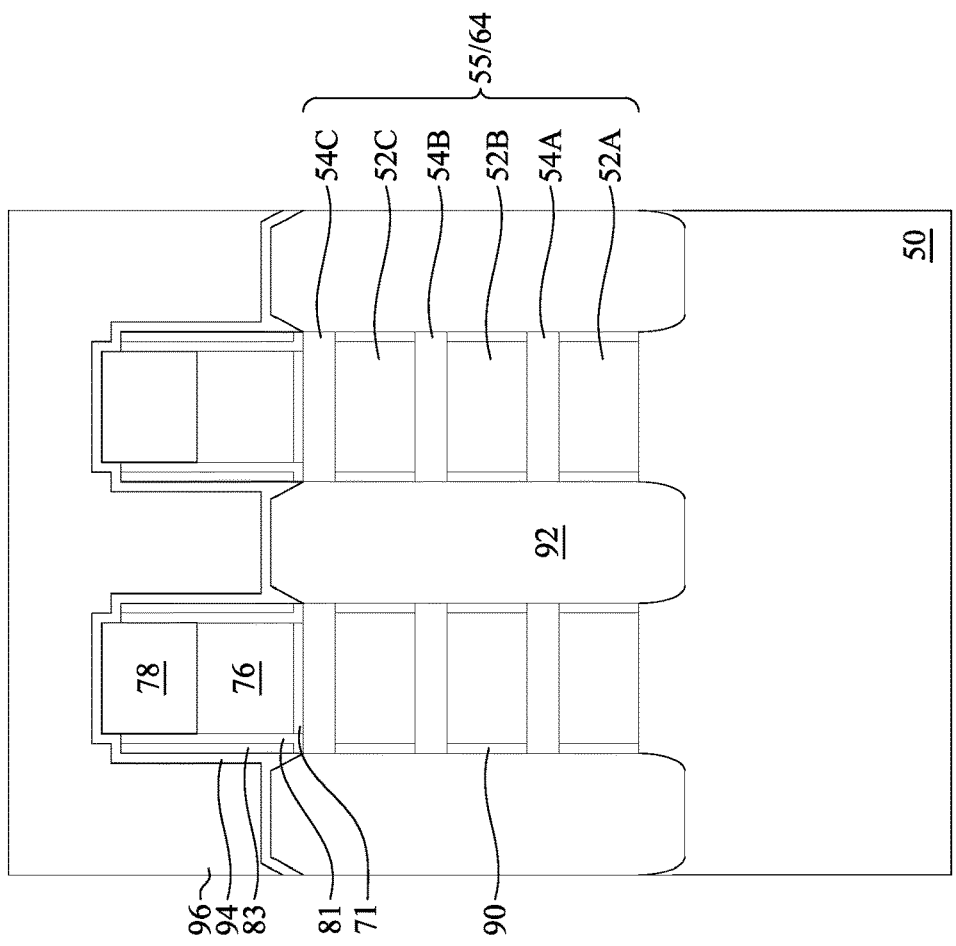
Figure 13A:
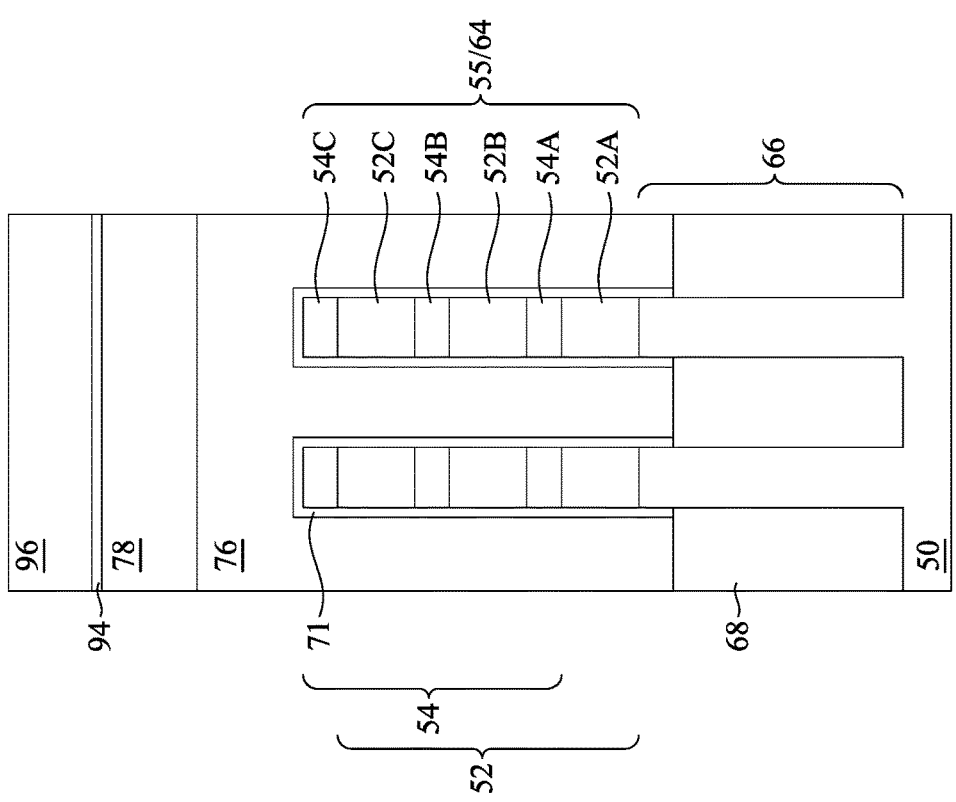

In FIGS. 13A and 13B, a first interlayer dielectric (ILD) 96 is deposited over the structure illustrated in FIGS. 12A and 12B. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), un-doped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 14B:
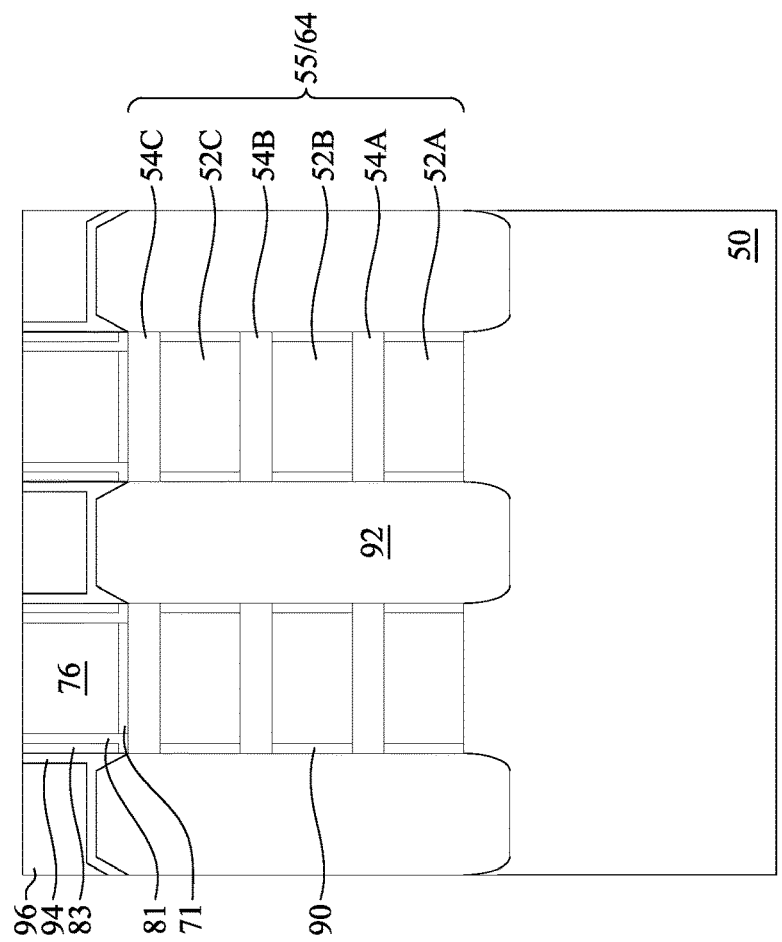
Figure 14A:
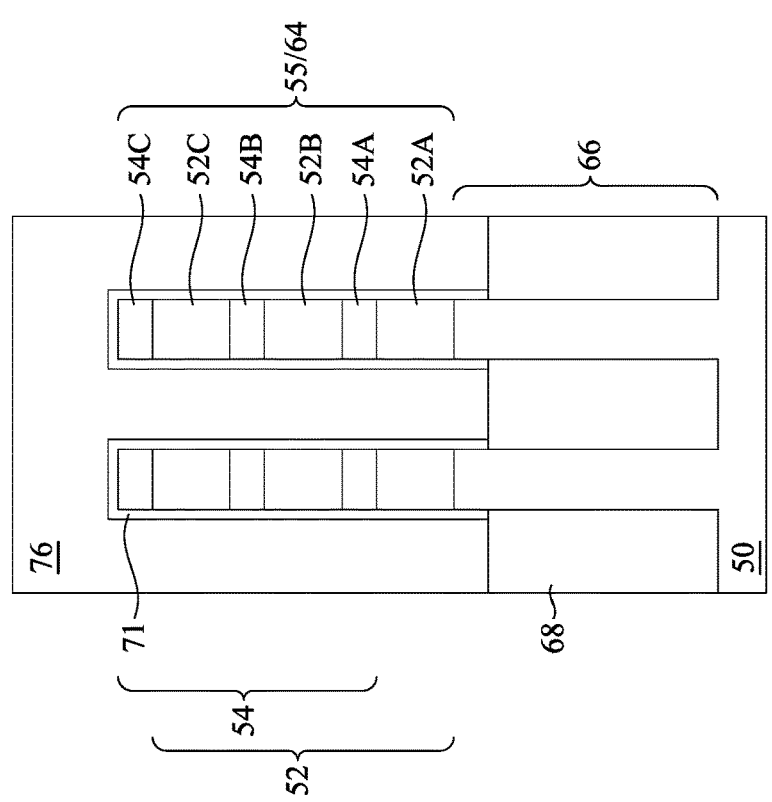

In FIGS. 14A and 14B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figures 15A, 15B:
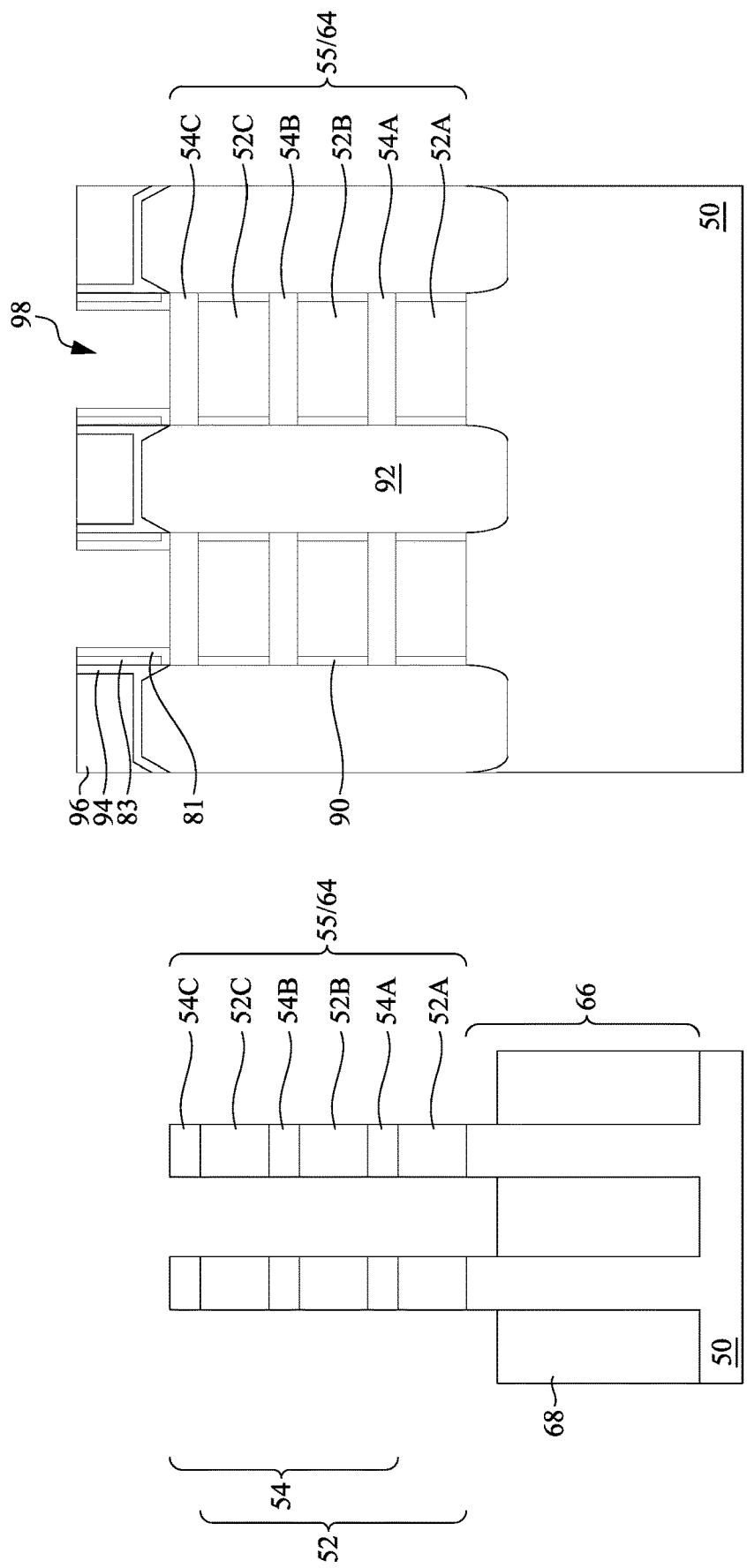

In FIGS. 15A and 15B, the dummy gates 76, and the masks 78 if present, are removed in one or more etching steps, so that second recesses 98 are formed. Portions of the dummy gate dielectrics 71 in the second recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96, the CESL 94, the first spacers 81, the second spacers 83, the nanostructures 55, or the STI regions 68. Each of the second recesses 98 exposes and/or overlies portions of nanostructures 55, which act as channel regions in subsequently completed nano-FETs. The portions of the nanostructures 55, which act as the channel regions, are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 16B:
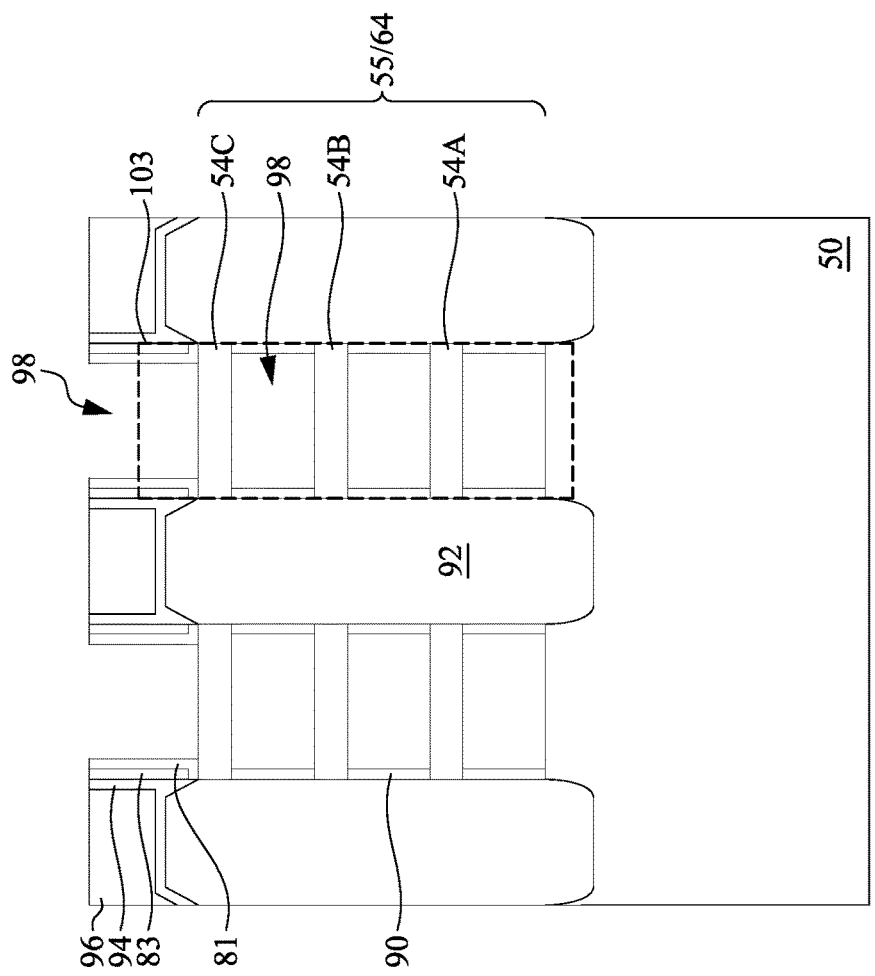
Figure 16A:
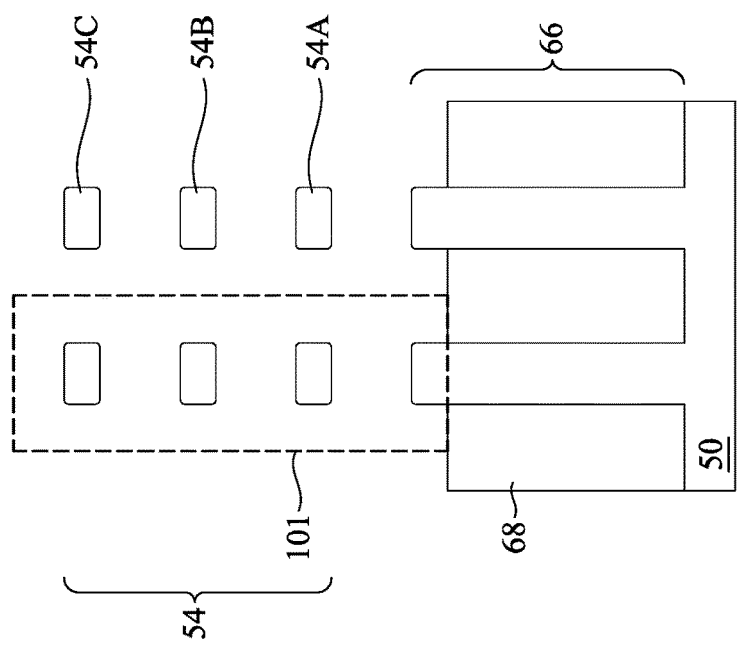

In FIGS. 16A and 16B, the first nanostructures 52 are removed extending the second recesses 98. The first nanostructures 52 may be removed by performing an isotropic etching process such as wet etching or the like using etchants selective to the materials of the first nanostructures 52, while the second nanostructures 54, the substrate 50, and the STI regions 68 remain relatively un-etched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide (NH₄OH), or the like may be used to remove the first nanostructures 52.

Figures 17A, 17B:
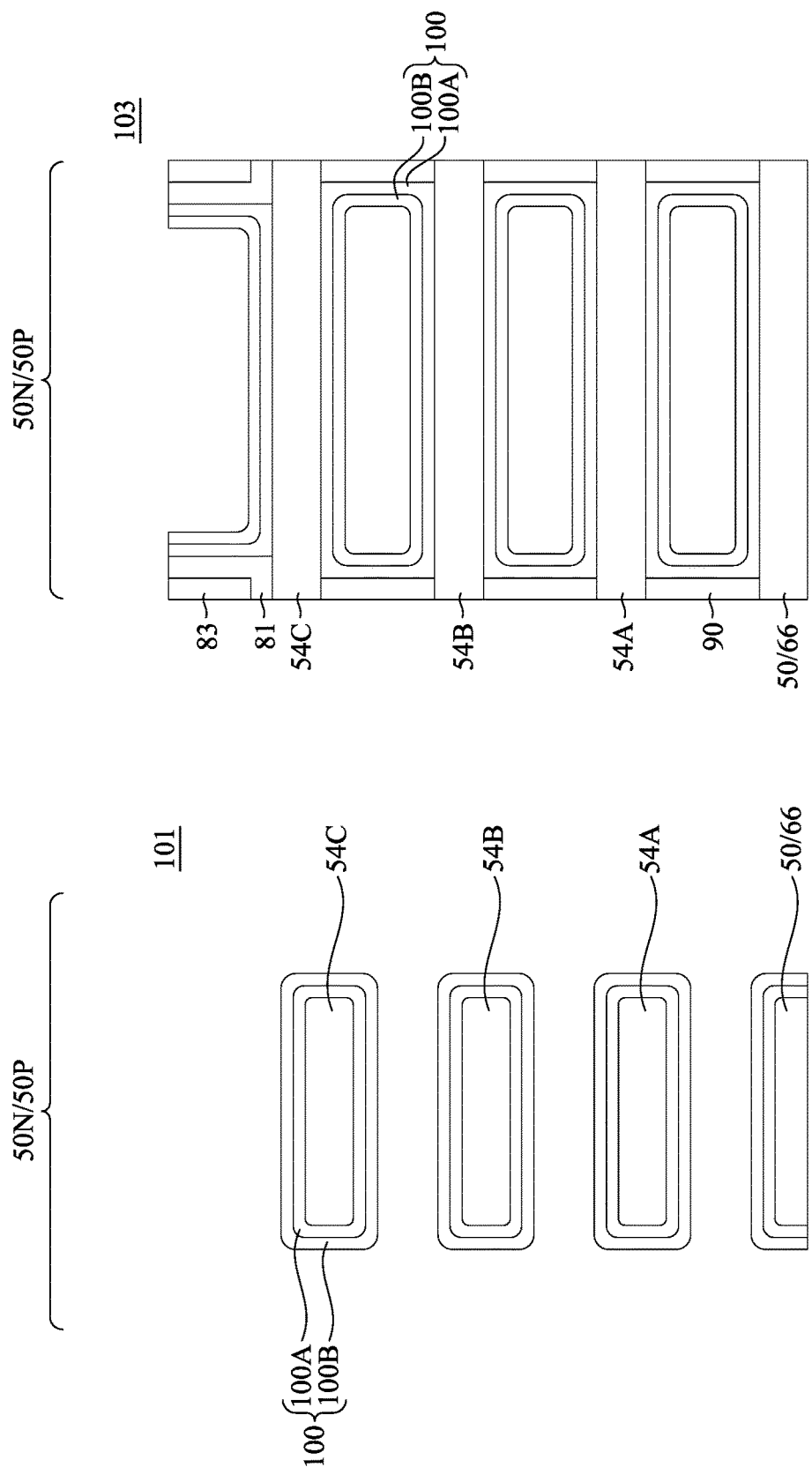
Figure 18B:
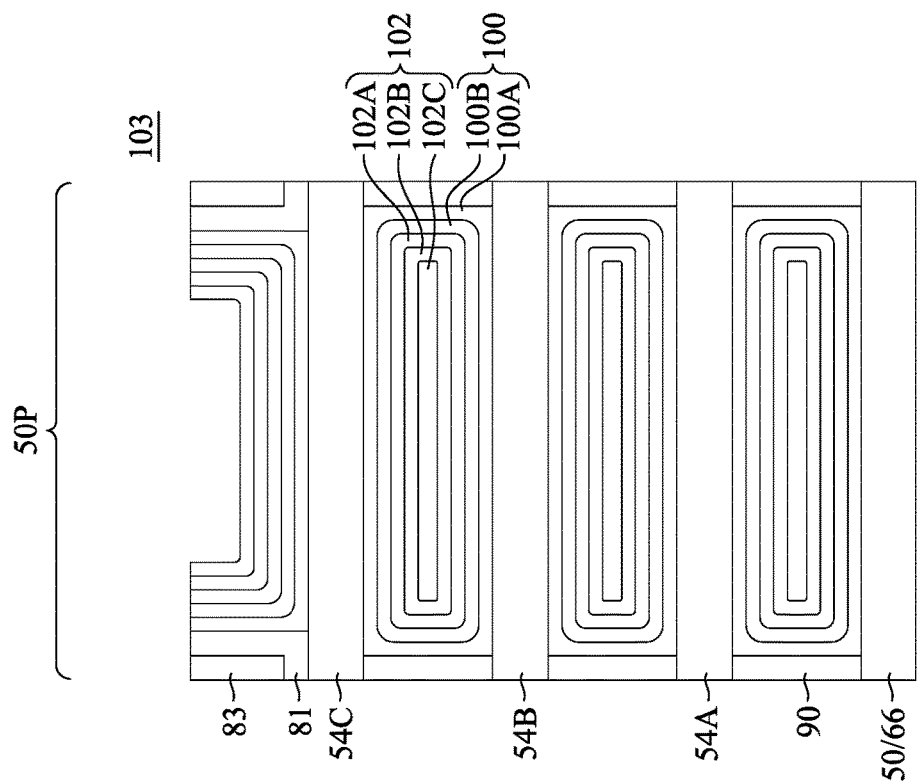
Figure 18A:
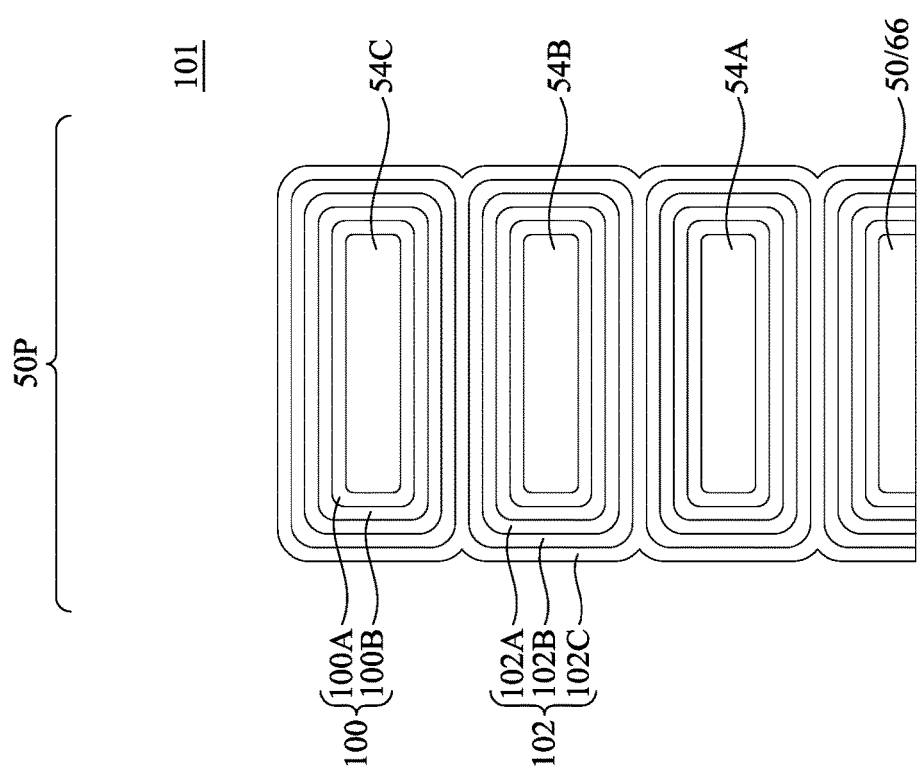
Figure 18C:
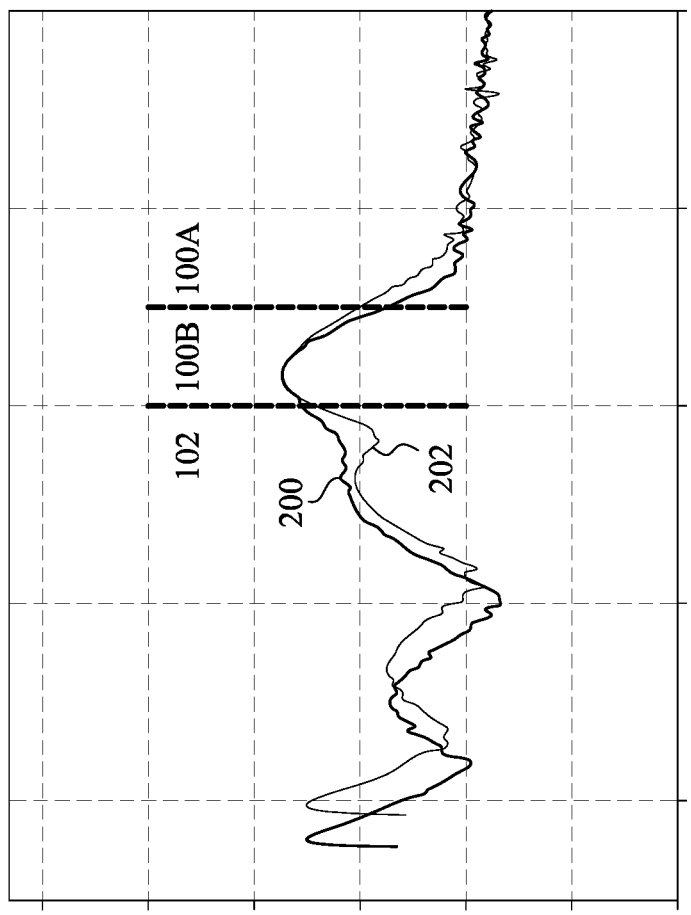
FIG. 18C illustrates a secondary ion mass spectrometry (SIMS) chart of dielectric layers and work function layers in example gate stacks, in accordance with some embodiments.
Figure 19B:
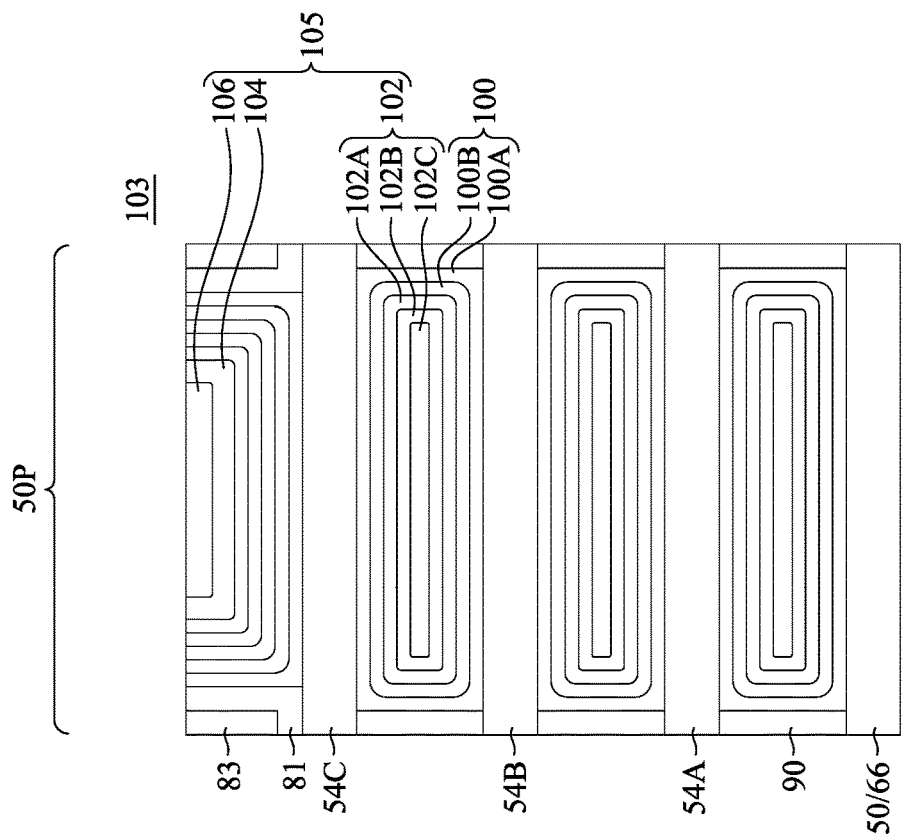
Figure 19A:
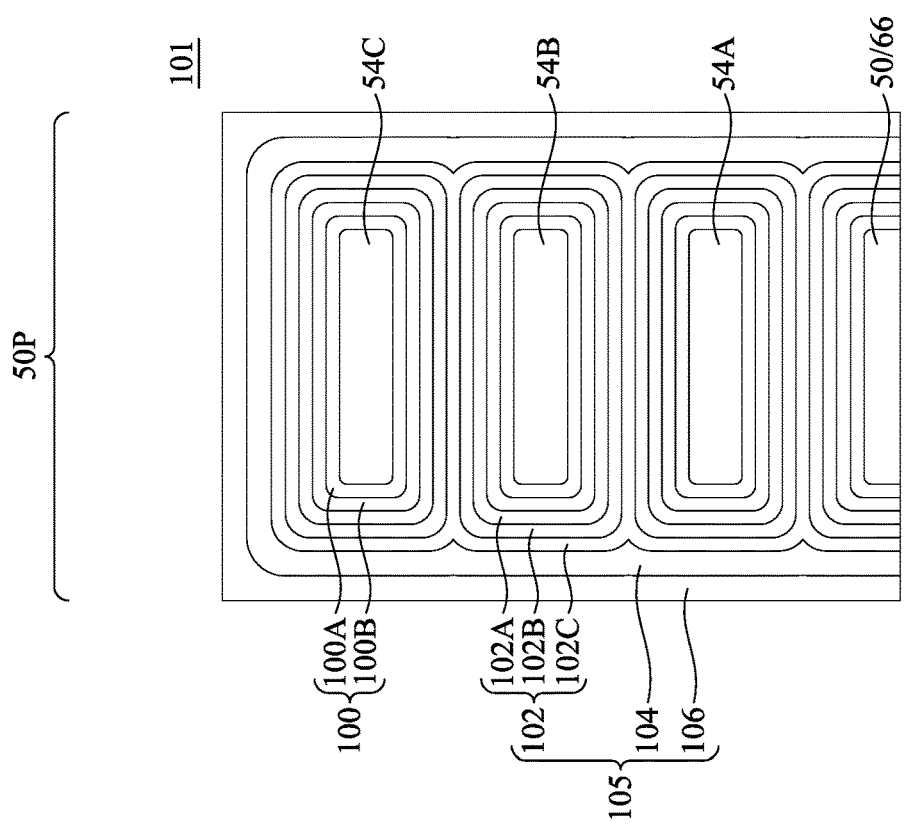
Figure 19D:
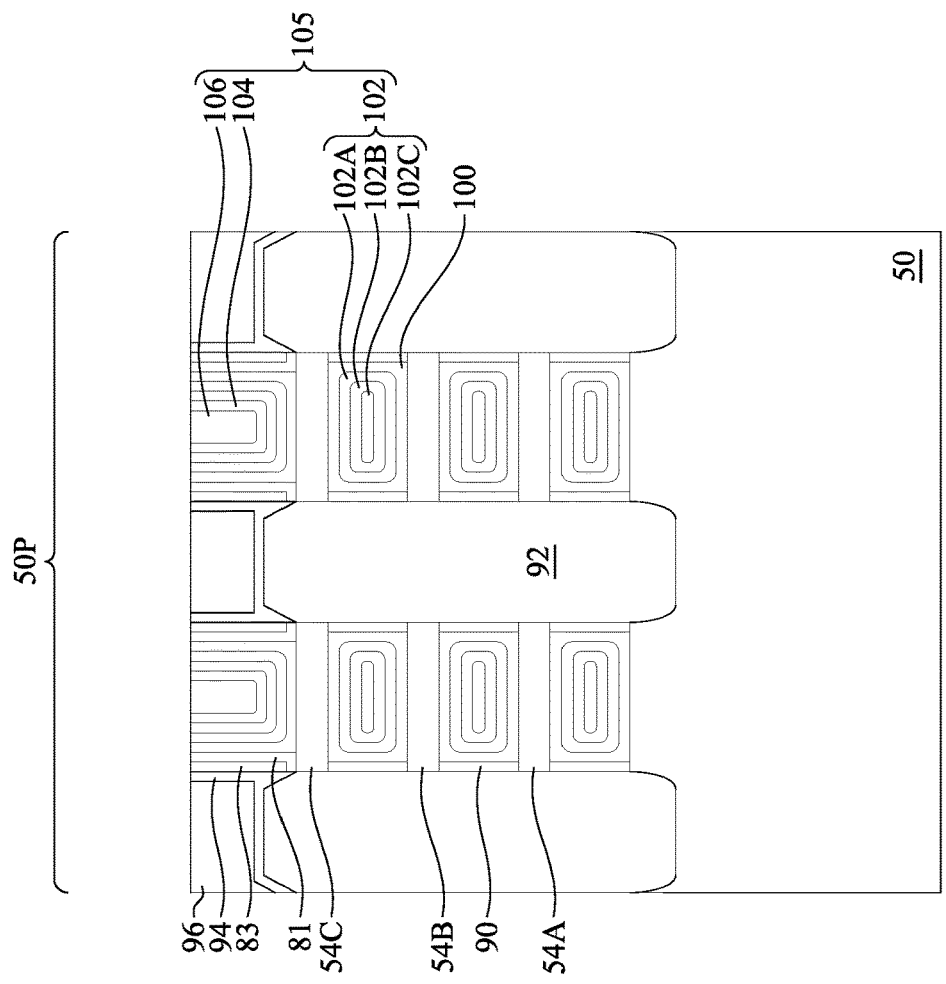
Figure 19C:
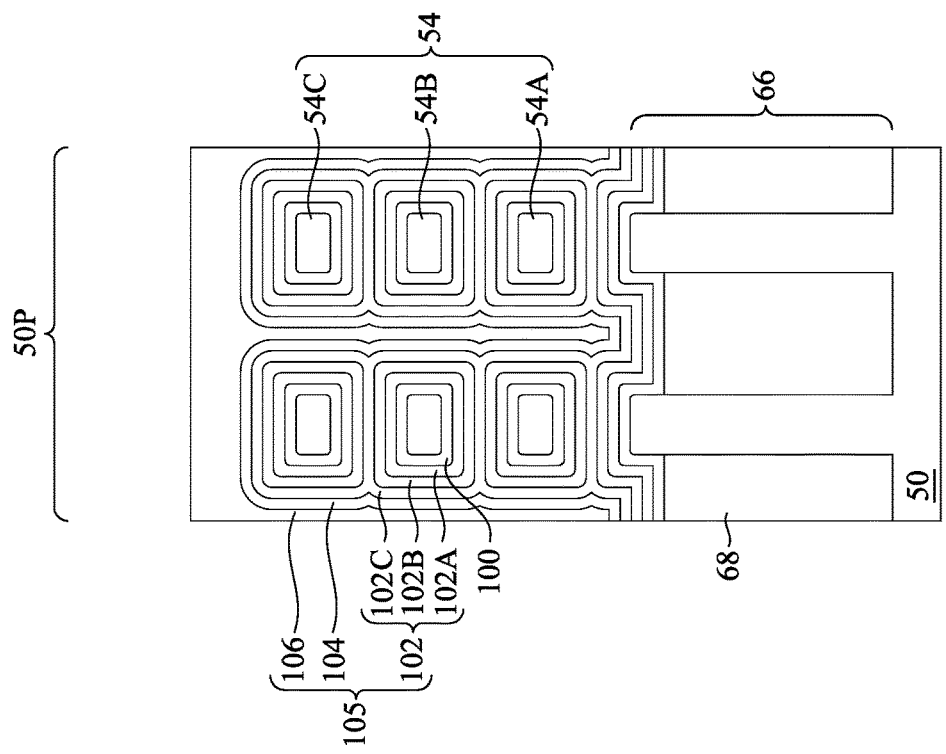
Figure 20B:
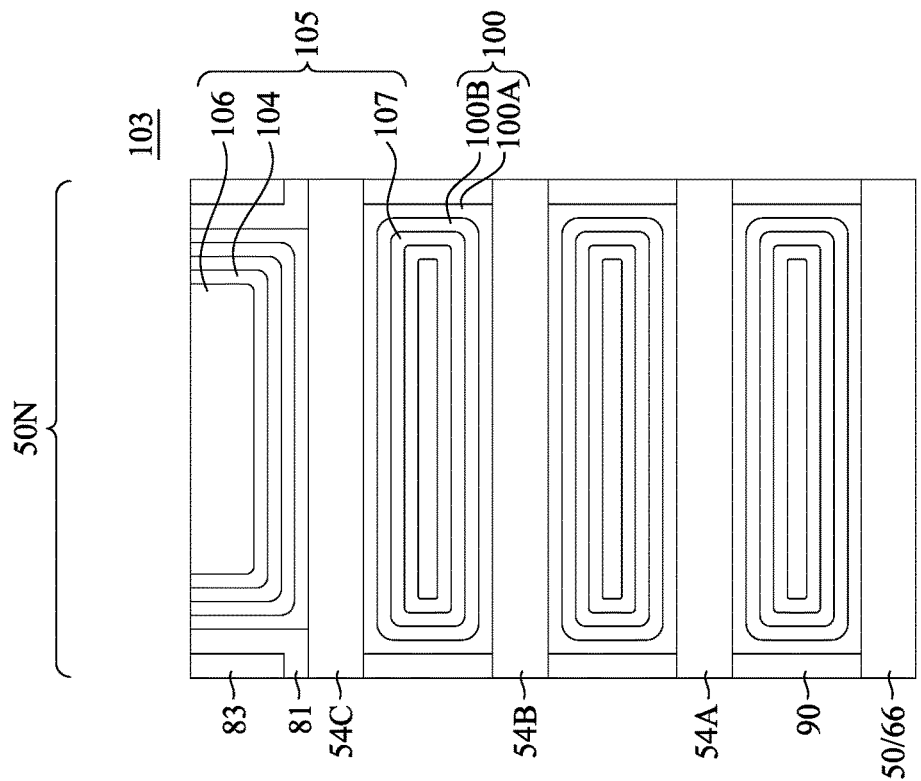
Figure 20A:
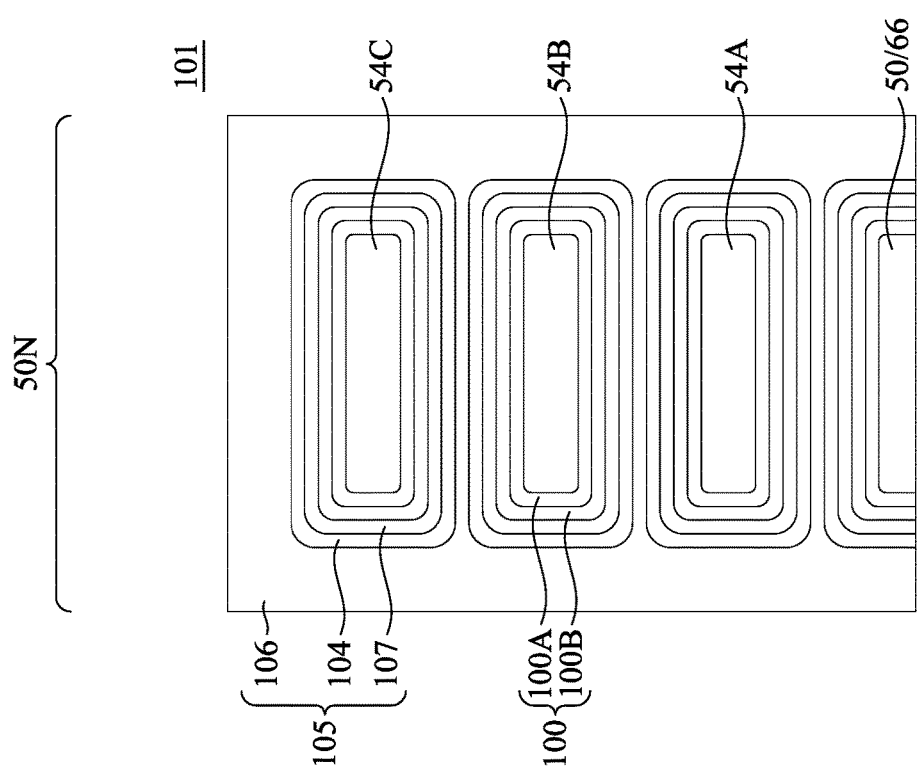
Figure 20D:
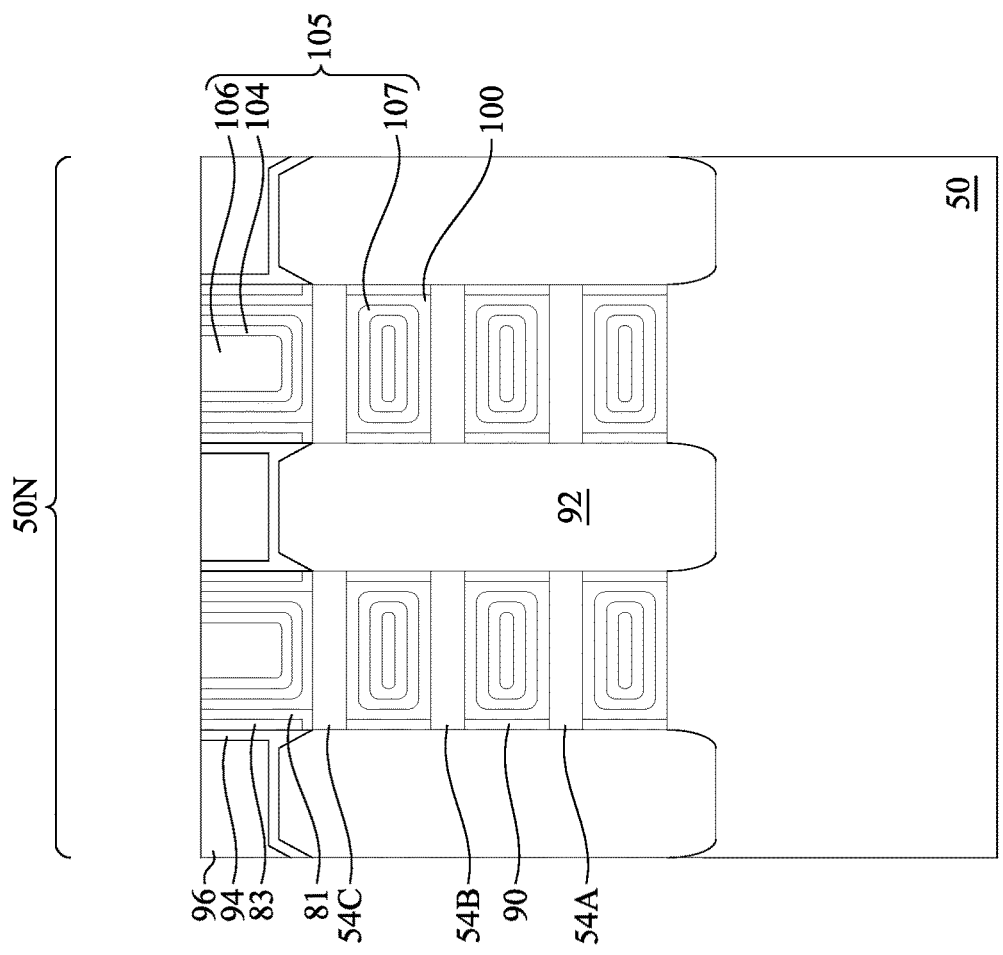

FIGS. 17A through 20D illustrate various steps used to form gate dielectrics wo and gate electrodes 105 (illustrated in FIGS. 19A through 20D) for replacement gates. The gate electrodes 105 and the gate dielectrics 100 may be collectively referred to as "gate stacks." FIGS. 17A, 18A, 19A, and 20A illustrate a detailed view of region 101 of FIG. 16A. FIGS. 17B, 18B, 19B, and 20B illustrate a detailed view of region 103 of FIG. 16B. FIGS. 17A and 178 illustrate features in either of the p-type region 50P or the n-type region 50N. FIGS. 18A through 19D illustrate features in the p-type region 50P and FIGS. 20A and 20D illustrate features in the n-type region 50N. The gate dielectrics 100 and the gate electrodes 105 may each include one or more sub-layers, which will be discussed in detail below.

In FIGS. 17A and 17B, interfacial layers 100A and first dielectric layers 100B are formed. The interfacial layers 100A and the first dielectric layers 100B may be collectively referred to as gate dielectrics 100. The interfacial layers 100A may be formed or deposited conformally in the second recesses 98, such as top surfaces and side surfaces of the fins 66 and on top surfaces, side surfaces, and bottom surfaces of the second nanostructures 54. The interfacial layers 100A may also be deposited on top surfaces of the first ILD 96, the CESL 94, the second spacers 83, and the STI regions 68; on top surfaces and side surfaces of the first spacers 81; and on side surfaces of the first inner spacers 90. The interfacial layers 100A may include dielectric materials such as silicon oxide (SiO₂), silicon oxynitride (SiON), or the like. The interfacial layers 100A may be formed by chemical oxidation, thermal oxidation, ALD, CVD, or the like. The interfacial layers 100A may have thicknesses from about 7 Å to about 30 Å.

The first dielectric layers 100B may be deposited over the interfacial layer 100A using conformal processes. The first dielectric layers 100B may be high-dielectric constant (high-k) materials (e.g., materials having a k-value greater than about 7.0), such as hafnium oxide (HfO₂), aluminum oxide (Al₂O₃), lanthanide oxide (LaO₂), titanium oxide (TiO₂), hafnium zirconium oxide (HfZrO₂), tantalum oxide (Ta₂O₃), hafnium silicon oxide (HfSiO₄), zirconium oxide (ZrO₂), zirconium silicon oxide (ZrSiO₂), combinations thereof or multiple layers thereof, or the like. The first dielectric layers 100B may be formed by ALD, CVD, or the like. In some embodiments, the interfacial layers 100A may be omitted and the first dielectric layers 100B may be deposited directly on the fins 66 and the second nanostructures 54. The first dielectric layers 100B may have thicknesses from about 1 nm to about 3 nm.

The formation of the interfacial layers 100A and the first dielectric layers 100B in the n-type region 50N and the p-type region 50P may occur simultaneously such that the gate dielectrics 100 in each region are formed from the same materials. In some embodiments, the gate dielectrics 100 in each region may be formed by distinct processes, such that the gate dielectrics 100 may be different materials. Various masking steps may be used to mask and expose appropriate regions when using distinct processes.

In FIGS. 18A and 18B, a first work function structure 102 is deposited over the gate dielectrics 100 in the p-type region 50P. The n-type region 50N may be masked while the first work function structure 102 is deposited in the p-type region 50P. In some embodiments, the first work function structure 102 may comprise a p-type work function structure. As illustrated in FIGS. 18A and 18B, the first work function structure 102 may include a first work function layer 102A, a second work function layer 102B, and a third work function layer 102C. Although the first work function structure 102 is illustrated as including three work function layers 102A-102C, additional or fewer layers may be included in the first work function structure 102.

The first work function layer 102A may be deposited over the first dielectric layers 100B using a process such as ALD, CVD, PVD, or the like. In some embodiments, the first work function layer 102A may include a p-type work function metal or material. The first work function layer 102A may include a transition metal nitride, such as titanium nitride (TiN), tantalum nitride (TaN), tungsten nitride (WN), molybdenum nitride (MoN), vanadium nitride (VN) or the like. In embodiments in which the first work function layer 102A includes titanium nitride, the first work function layer 102A may be deposited by a thermal ALD process including a titanium chloride (TiCl₄) precursor and an ammonia (NH₃) precursor, performed at a temperature ranging from about 200° C. to about 500° C. and at a pressure ranging from about 0.5 Torr to about 40 Torr. The first work function layer 102A may be deposited to a thickness ranging from about 0.5 nm to about 2.5 nm.

After the first work function layer 102A is deposited, an oxygen exposure process (also referred to as an oxygen treatment) may be performed on the first work function layer 102A. The first work function layer 102A may be deposited in a sealed chamber and a vacuum break may occur after depositing the first work function layer 102A. In some embodiments, the substrate 50 may be removed from the chamber in which the first work function layer 102A is deposited after the vacuum break occurs. In some embodiments, the oxygen exposure process may be performed by exposing the first work function layer 102A to an oxygen-containing ambient environment, which oxidizes the first work function layer 102A. The oxygen-containing ambient environment may include oxygen in a concentration ranging from about 1 atomic percent (at. %) to about 99 at. %. The first work function layer 102A may be exposed to the oxygen-containing ambient environment for a period ranging from about 2 hours to about 8 hours, at a temperature ranging from about 25° C. to about 600° C., and at a pressure ranging from about 0.1 Torr to about 500 Torr.

In some embodiments, the oxygen exposure process may include exposing the first work function layer 102A to an ozone (O₃)-containing environment. The ozone-containing environment may include ozone in a concentration ranging from about 1 at. % to about 99 at. %. In some embodiments, the first work function layer 102A may be exposed to a source gas, which includes ozone gas supplied with a carrier gas. The carrier gas may include an inert gas, such as argon (Ar), helium (He), xenon (Xe), neon (Ne), krypton (Kr), radon (Rn), the like, or a combination thereof, and the source gas may be supplied at a flowrate ranging from about 500 sccm to about 8,000 sccm. The first work function layer 102A may be exposed to the ozone-containing environment for a period ranging from about 10 seconds to about 300 seconds, at a temperature ranging from about 25° C. to about 600° C., and at a pressure ranging from about 0.1 Torr to about 500 Torr.

Performing the oxygen exposure process on the first work function layer 102A increases an oxygen concentration of the first work function layer 102A. For example, following the oxygen exposure process, an oxygen concentration in the first work function layer 102A may be from about 15 at. % to about 75 at. % or from about 50 at. % to about 60 at. %. The first work function layer 102A may have a gradient concentration of oxygen, which is greatest adjacent the first dielectric layers 100B and decreases as distance from the first dielectric layers 100B increases. Further, oxygen may diffuse through the first work function layer 102A to an interface between the first work function layer 102A and the first dielectric layers 100B. An oxygen concentration at the interface between the first work function layer 102A and the first dielectric layers 100B may range from about 50 at. % to about 60 at. %. Increasing the oxygen concentration in the first work function layer 102A and at the interface between the first work function layer 102A and the first dielectric layers 100B to the prescribed values increases the effective work function in the p-type region 50P, increases the flat band voltage ($V_{FB}$) (e.g., about 30 mV), and reduces the threshold voltage ($V_t$) in completed devices. This increases device speed and improves device performance for the completed devices. Performing the oxygen exposure process for a duration in the above-described ranges tunes a threshold voltage of the resulting transistor by a desired amount. Performing the oxygen exposure process for a duration outside of these ranges may not tune the threshold voltage of the resulting transistor sufficiently, may take an inordinate amount of time, or the like.

After the first work function layer 102A is deposited and the oxygen exposure process is performed on the first work function layer 102A, the second work function layer 102B may be deposited over the first work function layer 102A. The second work function layer 102B may be deposited by the same processes as the first work function layer 102A, and the oxygen exposure process may be performed on the second work function layer 102B after the second work function layer 102B is deposited. The second work function layer 102B may be deposited to a thickness ranging from about 0.5 nm to about 2.5 nm. Following the oxygen exposure process, an oxygen concentration in the second work function layer 102B may be from about 15 at. % to about 75 at. % or from about 50 at. % to about 60 at. %. The second work function layer 102B may have a gradient concentration of oxygen, which is greatest adjacent the first work function layer 102A and decreases as distance from the first work function layer 102A increases.

After the second work function layer 102B is deposited and the oxygen exposure process is performed on the second work function layer 102B, the third work function layer 102C may be deposited over the second work function layer 102B. The third work function layer 102C may be deposited by the same processes as the first work function layer 102A. In some embodiments, the oxygen exposure process may be performed on the third work function layer 102C after the third work function layer 102C is deposited. However, in some embodiments, the oxygen exposure process may be omitted from the third work function layer 102C and a vacuum environment may be maintained in the deposition chamber in which the third work function layer 102C is deposited. In embodiments in which the oxygen exposure process is not performed on the third work function layer 102C, the third work function layer 102C may have a lower oxygen concentration than either the first work function layer 102A or the second work function layer 102B. The third work function layer 102C may be deposited to a thickness ranging from about 0.5 nm to about 2.5 nm. An oxygen concentration in the third work function layer 102C may be from about 15 at. % to about 75 at. % or from about 50 at. % to about 60 at. %.

As illustrated in FIG. 18A, portions of the third work function layer 102C deposited on adjacent ones of the fins 66 and the second nanostructures 54 may merge with one another. The third work function layer 102C may fill spaces left between portions of the second work function layer 102B deposited on adjacent ones of the fins 66 and the second nanostructures 54 (e.g., in an inner sheet region). Although the first work function structure 102 is illustrated and described as including three work function layers, the first work function structure 102 may include any number of work function layers. The final layer of the first work function structure 102 may be a merged structure which fills the spaces between adjacent ones of the fins 66 and the second nanostructures 54 (e.g., in the inner sheet region).

FIG. 18C illustrates a secondary-ion mass spectrometry (SIMS) chart of the interfacial layers 100A, the first dielectric layers 100B, and the first work function structure 102. In an embodiment 200, the oxygen exposure process is performed on the first work function structure 102, while in an embodiment 202, the first work function structure 102 is deposited without performing the oxygen exposure process thereon. The y-axis provides the relative abundance of oxygen detected by the SIMS, while the x-axis proves the relative position of the oxygen within the interfacial layers 100A, the first dielectric layers 100B, and the first work function structure 102. As illustrated in FIG. 18C, performing the oxygen exposure process in the embodiment 200 increases the concentration of oxygen in the first work function structure 102 and at an interface between the first work function structure 102 and the first dielectric layers 100B relative to the embodiment 202. The concentration of oxygen in the first work function structure 102 may decrease as the distance from the first dielectric layers 100B increases. The concentration of oxygen in the first dielectric layers 100B may increase from the interface with the first work function structure 102 to a maximum at about halfway through the thickness of the first dielectric layers 100B and then decrease to the interface with the interfacial layers 100A. The concentration of oxygen in the interfacial layers 100A may be lower in the embodiment 200 than in the embodiment 202 and may decrease as the distance from the first dielectric layers 100B increases.

Performing the iterative deposition and oxygen exposure process described above for forming the first work function structure 102 in the p-type region 50P comprising the first work function layer 102A, the second work function layer 102B, and the third work function layer 102C increases the oxygen concentration throughout the first work function structure 102 and at the interface between the first work function structure 102 and the first dielectric layers 100B. This increases the effective work function in the p-type region 50P, increases the flat band voltage ($V_{FB}$) (e.g., about 30 mV), and reduces the threshold voltage (Vi) in completed devices. This increases device speed and improves device performance for the completed devices.

In FIGS. 19A through 19D, an adhesion layer 104 and a fill material 106 are deposited over the first work function structure 102. The combination of the first work function structure 102 (including the first work function layer 102A, the second work function layer 102B, and the third work function layer 102C), the adhesion layer 104, and the fill material 106 forms gate electrodes 105 in the p-type region 50P.

The adhesion layer 104 may be deposited conformally over the first work function structure 102. The adhesion layer 104 may be formed of a conductive material such as titanium nitride, tantalum nitride, or the like, which may be deposited by CVD, ALD, PECVD, PVD, or the like. The adhesion layer 104 may be referred to as a glue layer and may be used to improve adhesion between the subsequently deposited fill material 106 and the first work function structure 102. The adhesion layer 104 may be optional and may be omitted in some embodiments. The adhesion layer 104 may be deposited to a thickness ranging from about 1 nm to about 15 nm. The adhesion layer 104 may be deposited over the third work function layer 102C in the same deposition chamber as the third work function layer 102C is deposited and without breaking a vacuum of the deposition chamber.

The fill material 106 is deposited over the adhesion layer 104. In some embodiments, the fill material 106 may be formed of a conductive material, such as tungsten (W), aluminum (Al), cobalt (Co), ruthenium (Ru), combinations thereof, or the like. The fill material 106 may be deposited by CVD, ALD, PECVD, PVD, or the like. The fill material 106 fills the remaining portions of the second recesses 98, e.g., portions of the second recesses 98 not filled by the gate dielectrics 100, the first work function structure 102, and the adhesion layer 104. As illustrated in FIGS. 19C and 19D, after the fill material 106 is deposited, a planarization process may be performed on the gate dielectrics 100, the first work function structure 102, the adhesion layer 104, and the fill material 106 such that top surfaces of the gate electrodes 105 are level with top surfaces of the first ILD 96, the CESL 94, the first spacers 81, and the second spacers 83. The planarization process may be a chemical mechanical polish (CMP), an etch-back process, a combination thereof, or the like.

In FIGS. 20A through 20D, a second work function structure 107, the adhesion layer 104, and the fill material 106 are formed in the n-type region 50N. The p-type region 50P may be masked while the second work function structure 107 is deposited in the n-type region 50N. The combination of the second work function structure 107, the adhesion layer 104, and the fill material 106 forms gate electrodes 105 in the n-type region 50N.

The second work function structure 107 may be deposited conformally over the gate dielectrics 100. In some embodiments, the second work function structure 107 may include an n-type work function metal. The second work function structure 107 may be formed of a conductive material such as titanium aluminum (TiAl), titanium aluminum carbide (TiAlC), tantalum aluminum (TaAl), tantalum carbide (TaC), combinations thereof, or the like, which may be deposited by CVD, ALD, PECVD, PVD, or the like. The second work function structure 107 may be deposited to a thickness ranging from about 0.5 nm to about 2.5 nm.

Figure 20C:
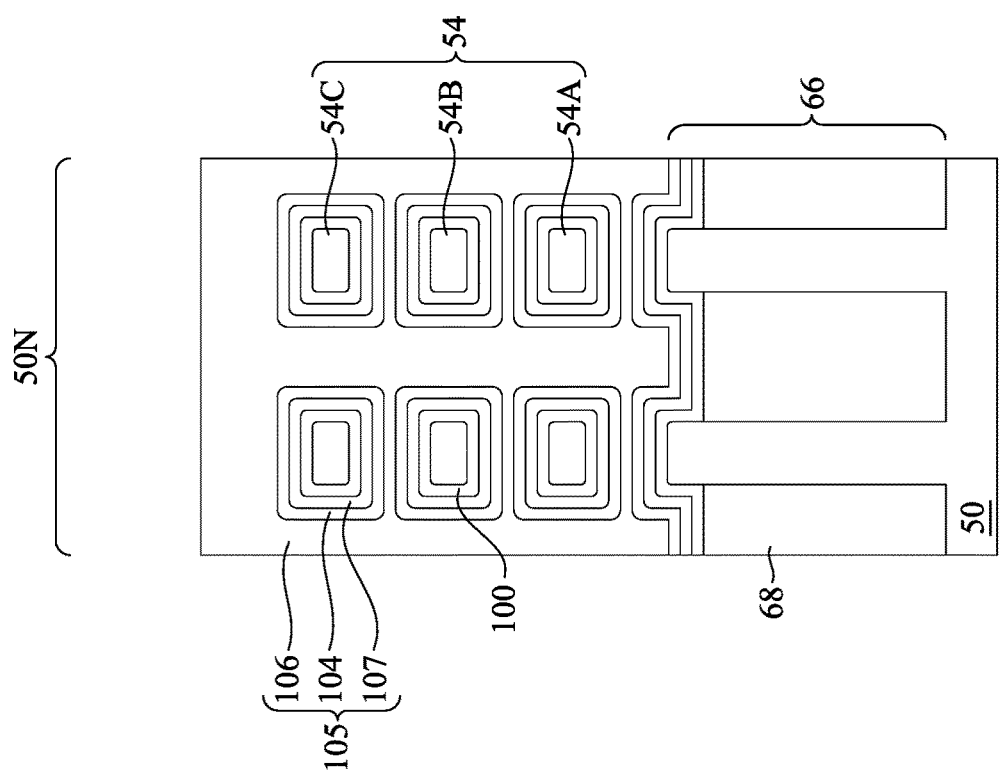

The adhesion layer 104 in the n-type region 50N may include materials and be deposited by processes the same as or similar to those of the adhesion layer 104 in the p-type region 50P. The fill material 106 in the n-type region 50N may include materials and be deposited by processes the same as or similar to those of the fill material 106 in the p-type region 50P. In some embodiments, the adhesion layer 104 and/or the fill material 106 in the n-type region 50N and the p-type region 50P may be deposited simultaneously; however, the adhesion layer 104 and the fill material 106 may be deposited separately in the n-type region 50N and the p-type region 50P and may be deposited in any order. As illustrated in FIGS. 20C and 20D, after the fill material 106 is deposited, a planarization process may be performed on the gate dielectrics 100, the second work function structure 107, the adhesion layer 104, and the fill material 106 such that top surfaces of the gate electrodes 105 are level with top surfaces of the first ILD 96, the CESL 94, the first spacers 81, and the second spacers 83. The planarization process may be a chemical mechanical polish (CMP), an etch-back process, a combination thereof, or the like.

Figure 21B:
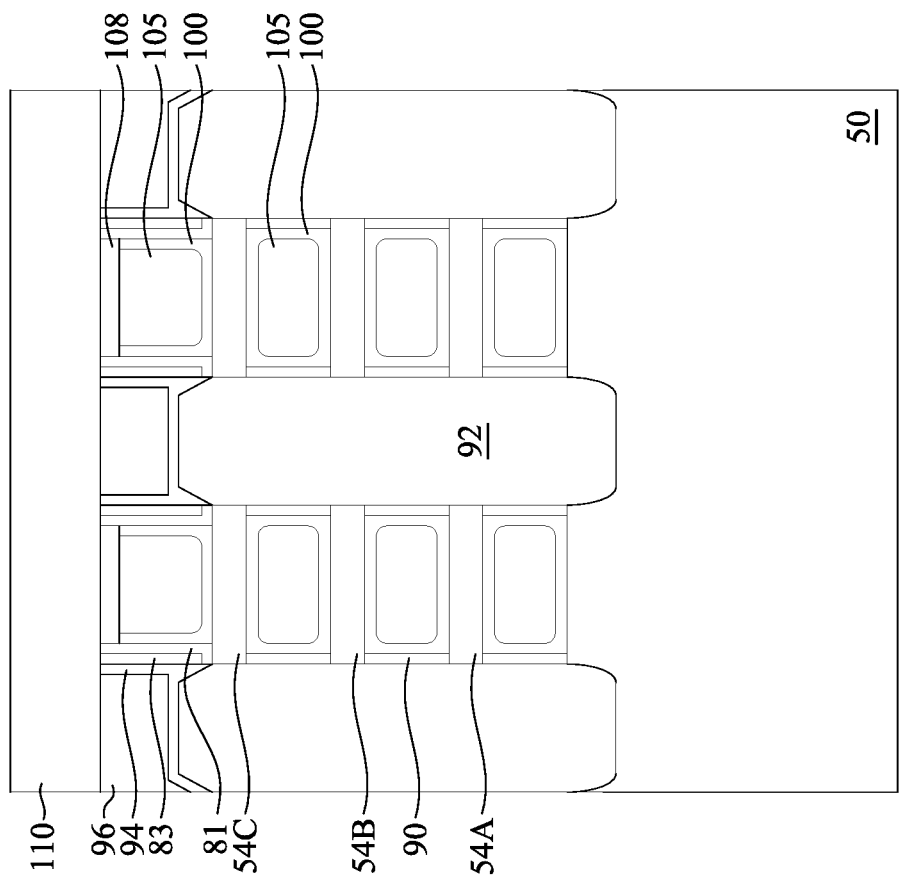
Figure 21A:
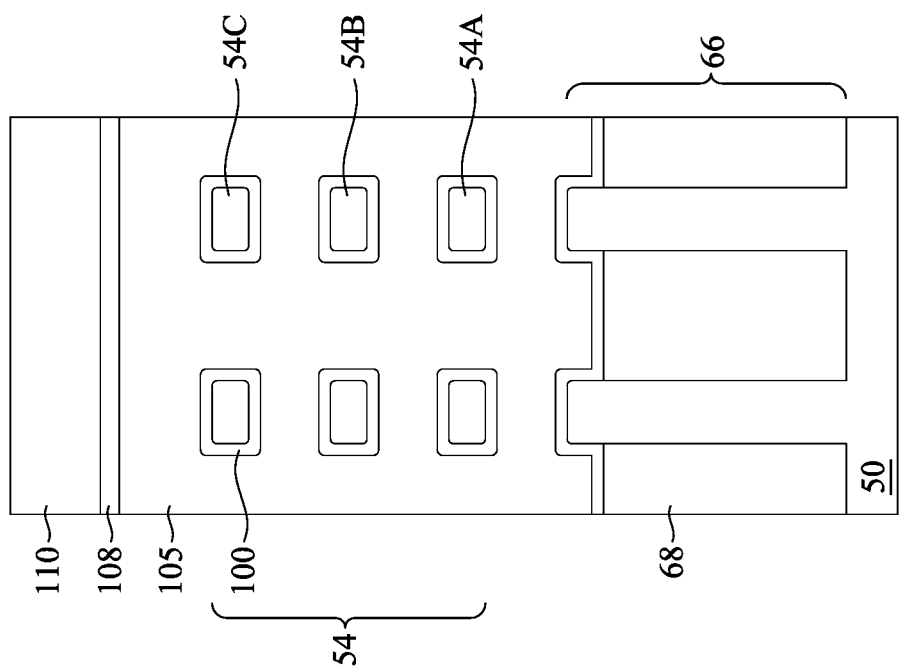

In FIGS. 21A and 21B, a second ILD no is deposited over the first ILD 96. In some embodiments, the second ILD no is a flowable film formed by FCVD. In some embodiments, the second ILD no is formed of a dielectric material such as PSG, BSG, BPSG, USG, or the like, and may be deposited by any suitable method, such as CVD, PECVD, or the like. In some embodiments, before the formation of the second ILD no, the gate stack (including the gate dielectrics 100 and the corresponding overlying gate electrodes 105) is recessed, so that a recess is formed directly over the gate stack and between opposing portions of first spacers 81. A gate mask 108 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 22A and 22B) penetrate through the gate mask 108 to contact the top surface of the recessed gate electrodes 105.

Figure 22B:
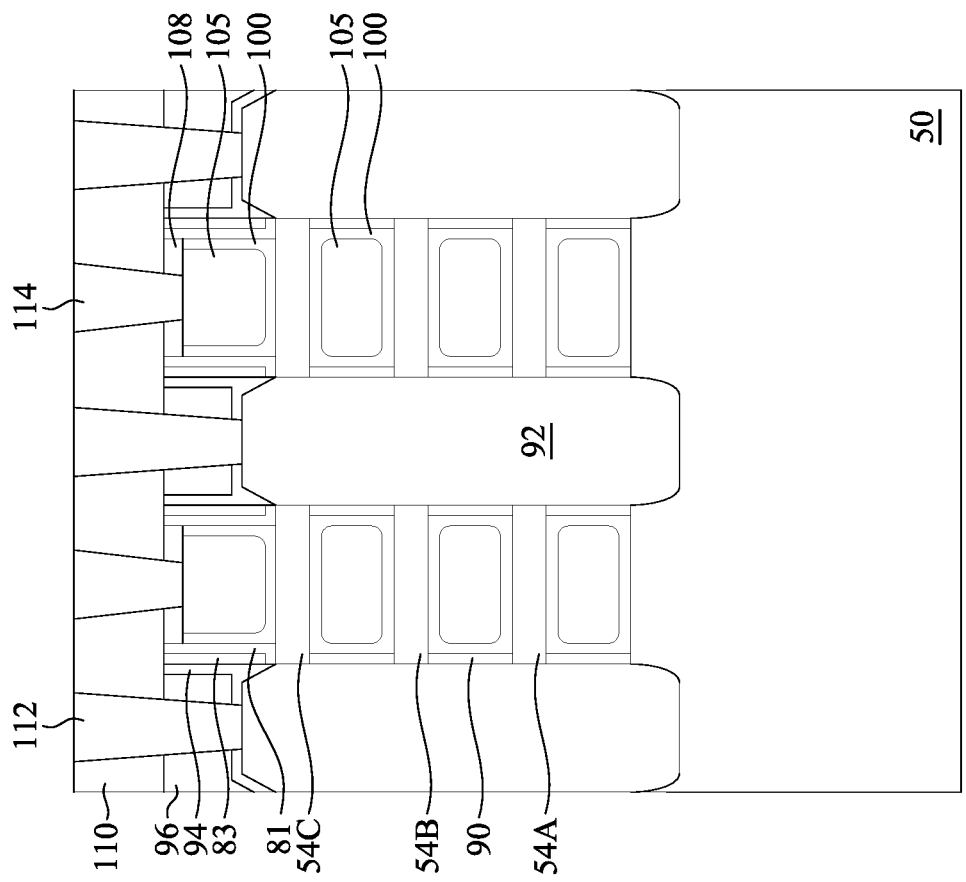
Figure 22A:
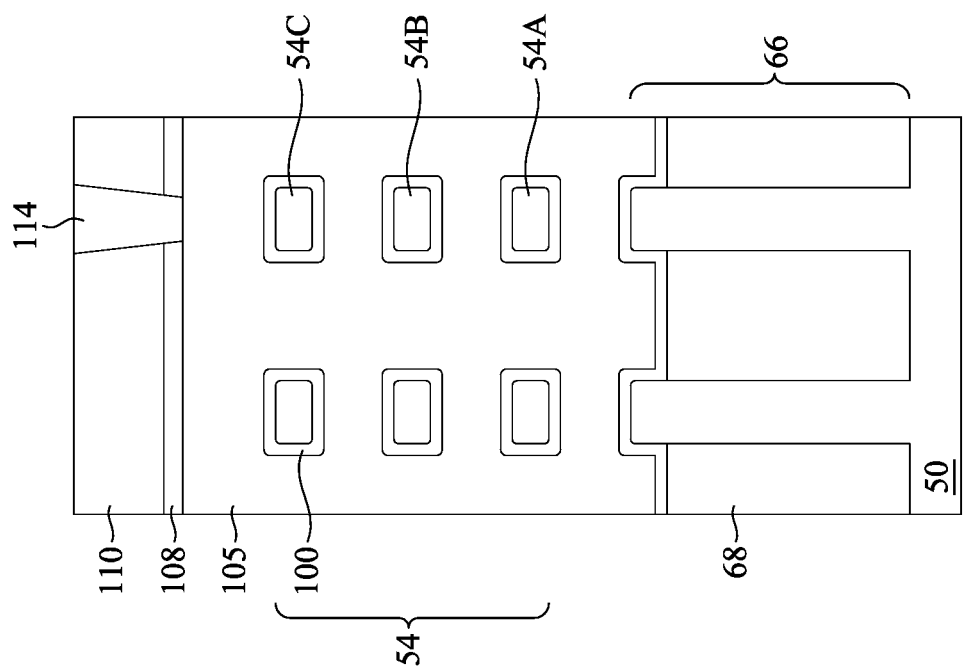

In FIGS. 22A and 22B, gate contacts 114 and source/drain contacts 112 are formed through the second ILD 110 and the first ILD 96. Openings for the source/drain contacts 112 are formed through the first ILD 96 and the second ILD 110 and openings for the gate contacts 114 are formed through the second ILD 110 and the gate mask 108. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 110. The remaining liner and conductive material form the source/drain contacts 112 and the gate contacts 114 in the openings. An anneal process may be performed to form a silicide at the interface between the epitaxial source/drain regions 92 and the source/drain contacts 112. The source/drain contacts 112 are physically and electrically coupled to the epitaxial source/drain regions 92, and the gate contacts 114 are physically and electrically coupled to the gate electrodes 105. The source/drain contacts 112 and the gate contacts 114 may be formed in different processes, or may be formed in the same process. Although shown as being formed in the same cross-sections, it should be appreciated that each of the source/drain contacts 112 and the gate contacts 114 may be formed in different cross-sections, which may avoid shorting of the contacts.

Embodiments may achieve advantages. For example, forming the p-type work function structure by the iterative process including deposition steps followed by oxygen exposure steps increases an oxygen concentration in the p-type work function structure and at an interface between the p-type work function structure and an underlying gate dielectric layer. This increases the effective work function in the p-type region, increases the flat band voltage ($V_{FB}$), and reduces the threshold voltage (Vi) in completed devices. This increases device speed and improves device performance for the completed devices.

In accordance with an embodiment, a device includes a first channel region; a second channel region; and a gate structure around the first channel region and the second channel region, the gate structure including a gate dielectric; a first p-type work function metal on the gate dielectric, the first p-type work function metal including oxygen, a first portion of the first p-type work function metal surrounds the first channel region, and a second portion of the first p-type work function metal is separated from the first portion of the first p-type work function metal and surrounds the second channel region; a second p-type work function metal on the first p-type work function metal, the second p-type work function metal having a lower concentration of oxygen than the first p-type work function metal, a third portion of the second p-type work function metal surrounds the first channel region, and a fourth portion of the second p-type work function metal is continuous with the third portion and surrounds the second channel region; and a fill layer on the second p-type work function metal. In an embodiment, the first p-type work function metal further includes titanium nitride. In an embodiment, an oxygen concentration of the first p-type work function metal is from 50 at. % to 60 at. %. In an embodiment, the gate dielectric includes hafnium oxide, the first p-type work function metal further includes titanium nitride, and an oxygen concentration at an interface between the gate dielectric and the first p-type work function metal is from 50 at. % to 60 at. %. In an embodiment, the first p-type work function metal has a gradient oxygen concentration which decreases as a distance from the gate dielectric increases. In an embodiment, the device further includes a third p-type work function metal between the first p-type work function metal and the second p-type work function metal, the third p-type work function metal having a gradient oxygen concentration which decreases as a distance from the gate dielectric increases, the first p-type work function metal, the second p-type work function metal, and the third p-type work function metal each include a transition metal nitride.

In accordance with another embodiment, a device includes a channel region; an interfacial layer on the channel region; a high-k gate dielectric layer on the interfacial layer; a first work function structure on the high-k gate dielectric layer, the first work function structure including a plurality of first work function layers, each of the first work function layers including a first p-type work function material and oxygen, a concentration of oxygen in the first work function structure decreasing as a distance from the high-k gate dielectric layer increases; an adhesion layer on the first work function structure; and a fill layer on the adhesion layer. In an embodiment, an oxygen concentration at an interface between the high-k gate dielectric layer and the first work function structure is from 50 at. % to 60 at. %. In an embodiment, the high-k gate dielectric layer includes hafnium oxide. In an embodiment, the first p-type work function material and the adhesion layer each include titanium nitride. In an embodiment, the adhesion layer is free from oxygen.

In accordance with yet another embodiment, a method includes depositing a gate dielectric layer on a channel region over a semiconductor substrate; depositing a first p-type work function metal on the gate dielectric layer; performing an oxygen treatment on the first p-type work function metal; and after performing the oxygen treatment, depositing a second p-type work function metal on the first p-type work function metal. In an embodiment, performing the oxygen treatment includes exposing the first p-type work function metal to an ambient environment. In an embodiment, the first p-type work function metal is exposed to the ambient environment for a duration of 2 hours to 8 hours. In an embodiment, performing the oxygen treatment includes exposing the first p-type work function metal to an ozone-containing environment. In an embodiment, the first p-type work function metal is exposed to the ozone-containing environment for a duration of 10 seconds to 300 seconds. In an embodiment, performing the oxygen treatment on the first p-type work function metal causes oxygen to diffuse through the first p-type work function metal to an interface between the first p-type work function metal and the gate dielectric layer. In an embodiment, performing the oxygen treatment on the first p-type work function metal includes removing the semiconductor substrate from a deposition chamber used to deposit the first p-type work function metal. In an embodiment, the first p-type work function metal is deposited at a temperature of 200° C. to 500° C. and a pressure of 0.5 Torr to 40 Torr. In an embodiment, the method further includes depositing an adhesion layer over the second p-type work function metal, the second p-type work function metal and the adhesion layer are deposited in a deposition chamber, a vacuum is maintained in the deposition chamber between depositing the second p-type work function metal and depositing the adhesion layer; and depositing a conductive fill material over the adhesion layer.

One general aspect of embodiments disclosed herein includes forming a first channel region structure and a second channel region structure over a substrate. The method also includes depositing a gate dielectric on the first channel region structure and the second channel region structure. The method also includes depositing a first p-type work function metal on the gate dielectric, where a first portion of the first p-type work function metal surrounds the first channel region structure, where a second portion of the first p-type work function metal surrounds the second channel region structure. The method also includes increasing an oxygen concentration at an interface between the first p-type work function metal and the gate dielectric by performing an oxygen exposure process on the first p-type work function metal. The method also includes depositing a second p-type work function metal on the first p-type work function metal. The method also includes increasing an oxygen concentration at an interface between the second p-type work function metal and the first p-type work function metal by performing an oxygen exposure process on the second p-type work function metal.

Another general aspect includes a p-type channel region. The device also includes an n-type channel region. The device also includes and a gate structure surrounding the p-type channel region and the n-type channel region, the gate structure may include a gate dielectric. The device also includes a first p-type work function metal on the gate dielectric, where a first portion of the first p-type work function metal surrounds the p-type channel region. The device also includes a second p-type work function metal on the first p-type work function metal, the second p-type work function metal having a lower concentration of oxygen than the first p-type work function metal, where a third portion of the second p-type work function metal surrounds the first portion of the first p-type work function metal. The device also includes a fill layer on the second p-type work function metal.

Yet another general aspect includes a device having channel region. The device also includes a high-k gate dielectric layer surrounding the channel region on at least four sides. The device also includes a first work function structure on the high-k gate dielectric layer, where a concentration of oxygen in the first work function structure decreases as a distance from the high-k gate dielectric layer increases. The device also includes an adhesion layer on the first work function structure. The device also includes a fill layer on the adhesion layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first channel region structure and a second channel region structure over a substrate; and
    depositing a gate dielectric on the first channel region structure and the second channel region structure;
    depositing a first p-type work function metal on the gate dielectric, wherein a first portion of the first p-type work function metal surrounds the first channel region structure, wherein a second portion of the first p-type work function metal surrounds the second channel region structure;
    increasing an oxygen concentration at an interface between the first p-type work function metal and the gate dielectric by performing an oxygen exposure process on the first p-type work function metal;
    depositing a second p-type work function metal on the first p-type work function metal; and
    increasing an oxygen concentration at an interface between the second p-type work function metal and the first p-type work function metal by performing an oxygen exposure process on the second p-type work function metal.

2. The method of claim 1, wherein the step of increasing an oxygen concentration at an interface between the second p-type work function metal and the first p-type work function metal comprises exposing the p-type work function metals to an ambient environment.

3. The method of claim 1, wherein the step of increasing an oxygen concentration at an interface between the second p-type work function metal and the first p-type work function metal comprises exposing the p-type work function metals to an ozone-containing environment.

4. The method of claim 1, wherein the step of increasing an oxygen concentration at an interface between the first p-type work function metal and the gate dielectric comprises exposing the first p-type work function metal to an ambient environment.

5. The method of claim 1, wherein the step of increasing an oxygen concentration at an interface between the first p-type work function metal and the gate dielectric comprises exposing the first p-type work function metal to an ozone-containing environment.

6. The method of claim 1, wherein the first p-type work function metal is deposited at a temperature of 200° C. to 500° C. and a pressure of 0.5 Torr to 40 Torr.

7. The method of claim 1, wherein the step of depositing a first p-type work function metal on the gate dielectric includes depositing a titanium nitride containing layer.

8. The method of claim 1, wherein the step of increasing an oxygen concentration at an interface between the first p-type work function metal and the gate dielectric, increases an oxygen concentration of the first p-type work function metal to a range of from 50 at. % to 60 at. %.

9. The method of claim 1, wherein the step of increasing an oxygen concentration at an interface between the first p-type work function metal and the gate dielectric, forms a gradient oxygen concentration in the first p-type work function metal that decreases as a distance from the gate dielectric increases.

10. The method of claim 1, further comprising forming the interface between the first p-type work function metal and the second p-type work function metal by depositing a third p-type work function metal on the first p-type work function metal.

11. The method of claim 10, wherein the step of increasing an oxygen concentration at an interface between the second p-type work function metal and the first p-type work function metal forms a gradient oxygen concentration in the third p-type work function metal that decreases as a distance from the gate dielectric increases.

12. A device comprising:
    a p-type channel region;
    an n-type channel region; and
    a gate structure surrounding the p-type channel region and the n-type channel region, the gate structure comprising:
        a gate dielectric;
        a first p-type work function metal on the gate dielectric, wherein a first portion of the first p-type work function metal surrounds the p-type channel region;
        a second p-type work function metal on the first p-type work function metal, the second p-type work function metal having a lower concentration of oxygen than the first p-type work function metal, wherein a third portion of the second p-type work function metal surrounds the first portion of the first p-type work function metal; and
        a fill layer on the second p-type work function metal.

13. The device of claim 12, further comprising an interfacial layer between the p-type channel region and the gate dielectric.

14. The device of claim 12, further comprising a third p-type work function metal at an interface between the first p-type work function metal and the second p-type work function metal.

15. The device of claim 14, wherein the third p-type work function metal has a gradient oxygen concentration that decreases as a distance from the gate dielectric increases.

16. The device of claim 14, wherein the first p-type work function metal, the second p-type work function metal, and the third p-type work function metal each comprise a transition metal nitride.

17. A device comprising:
    a channel region;
    a high-k gate dielectric layer surrounding the channel region on at least four sides;
    a first work function structure on the high-k gate dielectric layer, wherein a concentration of oxygen in the first work function structure decreases as a distance from the high-k gate dielectric layer increases;
    an adhesion layer on the first work function structure; and
    a fill layer on the adhesion layer.

18. The device of claim 17, further comprising an adhesion layer on the first work function structure.

19. The device of claim 17, wherein an oxygen concentration at an interface between the high-k gate dielectric layer and the first work function structure is from 50 at. % to 60 at. %.

20. The device of claim 17, wherein the adhesion layer is free from oxygen.

* * * * *